United States Patent
Sasaki et al.

(10) Patent No.: US 9,899,483 B2
(45) Date of Patent: Feb. 20, 2018

(54) SEMICONDUCTOR DEVICE

(71) Applicant: Semiconductor Energy Laboratory Co., Ltd., Atsugi-shi, Kanagawa-ken (JP)

(72) Inventors: Toshinari Sasaki, Shinagawa (JP); Takashi Hamochi, Shimotsuga (JP); Toshiyuki Miyamoto, Kanuma (JP); Masafumi Nomura, Tochigi (JP); Junichi Koezuka, Tochigi (JP); Kenichi Okazaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 605 days.

(21) Appl. No.: 13/920,442

(22) Filed: Jun. 18, 2013

(65) Prior Publication Data

US 2014/0001466 A1    Jan. 2, 2014

(30) Foreign Application Priority Data

Jun. 29, 2012    (JP) ................. 2012-147703

(51) Int. Cl.
*H01L 29/78* (2006.01)
*H01L 21/16* (2006.01)
(Continued)

(52) U.S. Cl.
CPC ........ *H01L 29/247* (2013.01); *H01L 29/7869* (2013.01); *H01L 29/78606* (2013.01)

(58) Field of Classification Search
CPC ..... H01L 29/7869; H01L 21/16; H01L 21/00; H01L 29/24; H01L 21/479
(Continued)

(56) References Cited

U.S. PATENT DOCUMENTS 5,528,032 A    6/1996 Uchiyama et al.
5,731,856 A    3/1998 Kim et al.
(Continued)

FOREIGN PATENT DOCUMENTS

CN    1405898    3/2003
CN    102184965    9/2011
(Continued)

OTHER PUBLICATIONS

International Search Report (Application No. PCT/JP2013/067165) dated Aug. 13, 2013.
(Continued)

*Primary Examiner* — Allen Parker
*Assistant Examiner* — Didarul Mazumder
(74) *Attorney, Agent, or Firm* — Eric J. Robinson; Robinson Intellectual Property Law Office, P.C.

(57) ABSTRACT

In a transistor including an oxide semiconductor film, movement of hydrogen and nitrogen to the oxide semiconductor film is suppressed. Further, in a semiconductor device using a transistor including an oxide semiconductor film, a change in electrical characteristics is suppressed and reliability is improved. A transistor including an oxide semiconductor film and a nitride insulating film provided over the transistor are included, and an amount of hydrogen molecules released from the nitride insulating film by thermal desorption spectroscopy is less than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and an amount of ammonia molecules released from the nitride insulating film by thermal desorption spectroscopy is less than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$.

19 Claims, 23 Drawing Sheets

(51) Int. Cl.
 *H01L 29/24* (2006.01)
 *H01L 21/47* (2006.01)
 *H01L 29/786* (2006.01)

(58) Field of Classification Search
 USPC .......................................... 257/410, 411, 43
 See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,242,837 B2 | 8/2012 | Yamazaki et al. |
| 8,274,077 B2 | 9/2012 | Akimoto et al. |
| 8,350,621 B2 | 1/2013 | Yamazaki et al. |
| 8,440,510 B2 | 5/2013 | Yamazaki |
| 8,466,463 B2 | 6/2013 | Akimoto et al. |
| 8,502,217 B2 | 8/2013 | Sato et al. |
| 8,803,589 B2 | 8/2014 | Yamazaki et al. |
| 9,419,020 B2 | 8/2016 | Yamazaki et al. |
| 9,425,045 B2 | 8/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008724 A1* | 1/2009 | Mishima et al. ............ 257/410 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0233848 A1 | 9/2010 | Ohara et al. |
| 2011/0101335 A1 | 5/2011 | Yamazaki et al. |
| 2011/0140205 A1 | 6/2011 | Sakata et al. |
| 2011/0175674 A1 | 7/2011 | Shimizu et al. |
| 2011/0269266 A1* | 11/2011 | Yamazaki ..................... 438/104 |
| 2011/0287580 A1 | 11/2011 | Yamazaki et al. |
| 2011/0303914 A1* | 12/2011 | Yamazaki ....................... 257/43 |
| 2011/0309456 A1 | 12/2011 | Yamazaki |
| 2012/0001170 A1* | 1/2012 | Yamazaki ....................... 257/43 |
| 2012/0112045 A1* | 5/2012 | Tsubuku et al. ............ 250/214.1 |
| 2012/0241736 A1 | 9/2012 | Imoto et al. |
| 2012/0241738 A1 | 9/2012 | Imoto et al. |
| 2013/0234135 A1 | 9/2013 | Mochizuki et al. |
| 2014/0367682 A1 | 12/2014 | Yamazaki et al. |
| 2016/0190176 A1 | 6/2016 | Yamazaki et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2007-073562 A | 3/2007 |
| JP | 2007-096055 | 4/2007 |
| JP | 2007-123861 | 5/2007 |
| JP | 2009-141002 A | 6/2009 |
| JP | 2009-224479 | 10/2009 |
| JP | 2011-108882 A | 6/2011 |
| JP | 2011-109646 A | 6/2011 |
| JP | 2011-119706 A | 6/2011 |
| JP | 2011-146574 A | 7/2011 |
| JP | 2012-004554 A | 1/2012 |
| JP | 2012-023359 A | 2/2012 |
| JP | 2012-094757 A | 5/2012 |
| JP | 2012-114428 A | 6/2012 |
| KR | 2003-0022692 A | 3/2003 |
| KR | 2012-0048514 A | 5/2012 |
| TW | 552718 | 9/2003 |
| TW | 201203392 | 1/2012 |
| TW | 201212234 | 3/2012 |
| WO | WO-2004/114391 | 12/2004 |
| WO | WO-2009/072532 | 6/2009 |
| WO | WO-2010/103935 | 9/2010 |
| WO | WO-2011/049005 | 4/2011 |
| WO | WO-2011/052384 | 5/2011 |
| WO | WO-2011/142467 | 11/2011 |
| WO | WO-2011/145538 | 11/2011 |
| WO | WO-2011/158703 | 12/2011 |

OTHER PUBLICATIONS

Written Opinion (Application No. PCT/JP2013/067165) dated Aug. 13, 2013.
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, 1637-1640.
Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3-Ga2ZnO4-ZnO system at 1350°C,", Journal of Solid State Chemicstry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generational Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-in. AMOLED Display With Driver Circuit Using Amorphous In-Ga-Zn-Oxide TFTs,", IDW '09 : Proceedings of the 16th International Display Workshops, 2009, 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1100-1112.
Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatues Over 1000°C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Chinese Office Action (Application No. 201380034567.4) dated Nov. 2, 2016.
Taiwanese Office Action (Application No. 102121959) dated Feb. 18, 2017.
Taiwanese Office Action (Application No. 102121959) dated Dec. 19, 2017.

* cited by examiner

FIG. 16A M/z=2(H₂)
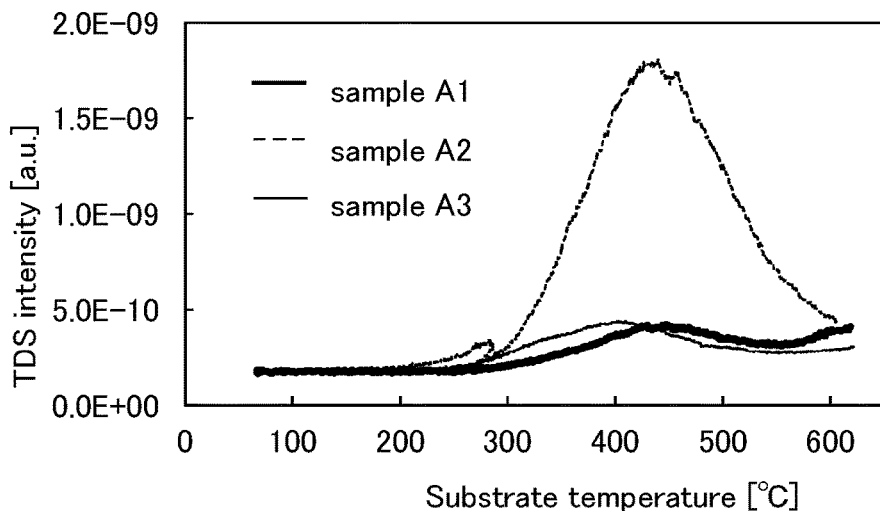
FIG. 16B M/z=18(H₂O)
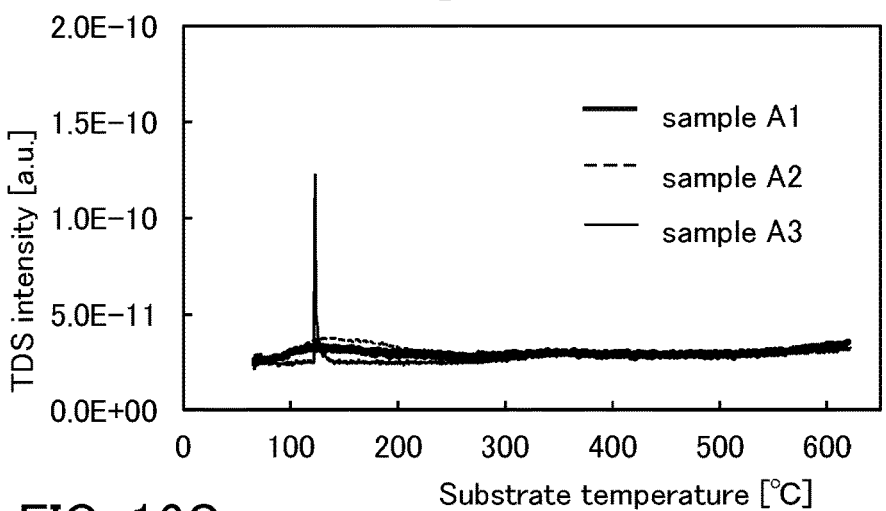
FIG. 16C
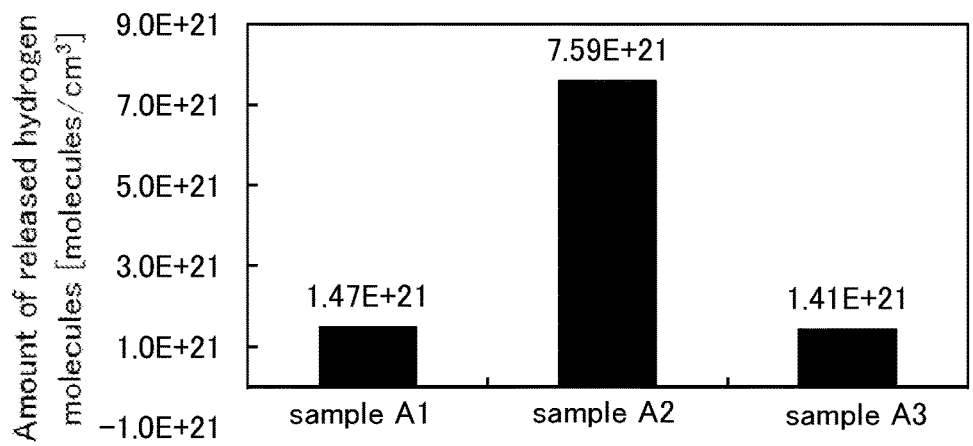

FIG. 17A  M/z=17(NH₃)
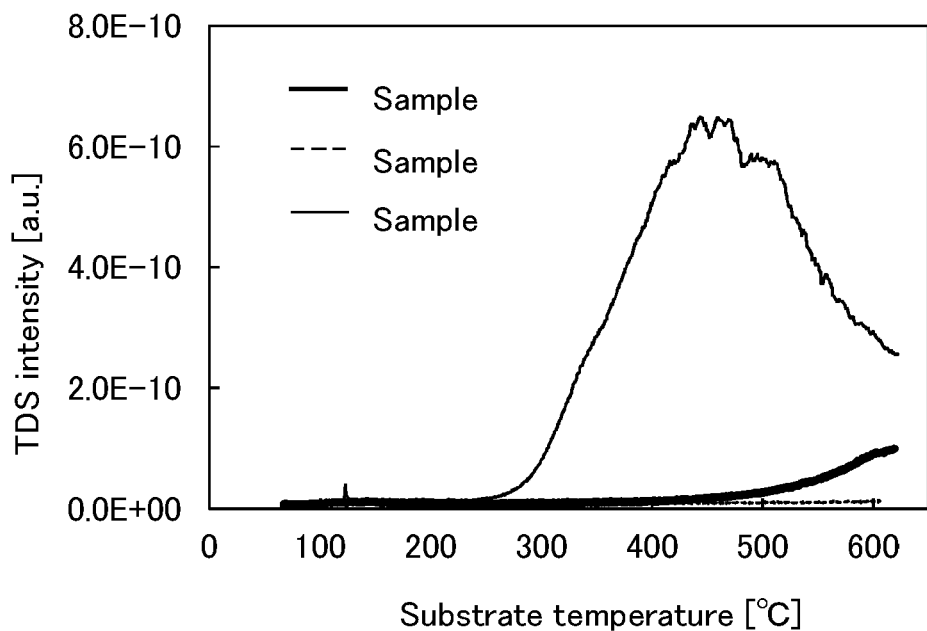
FIG. 17B
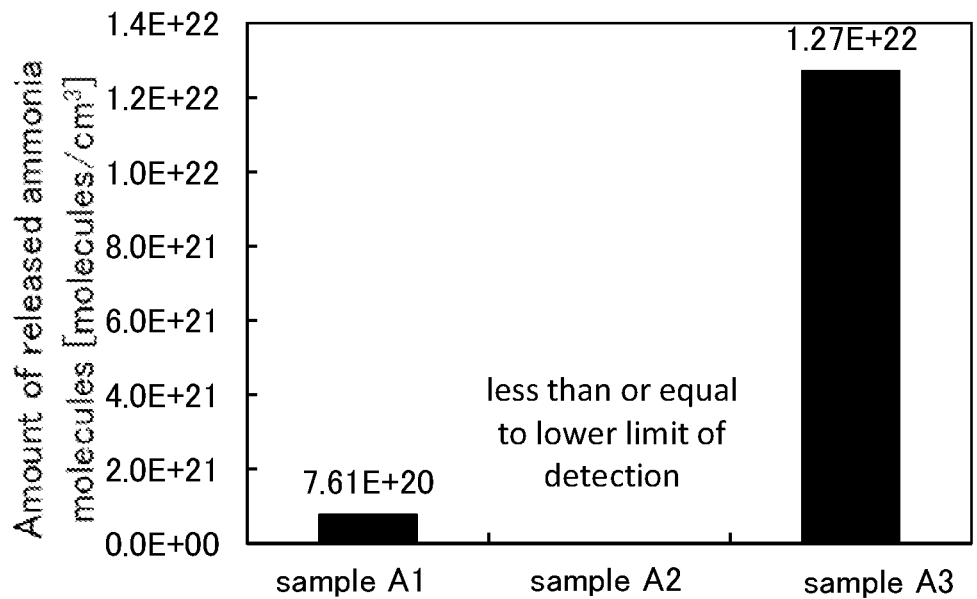

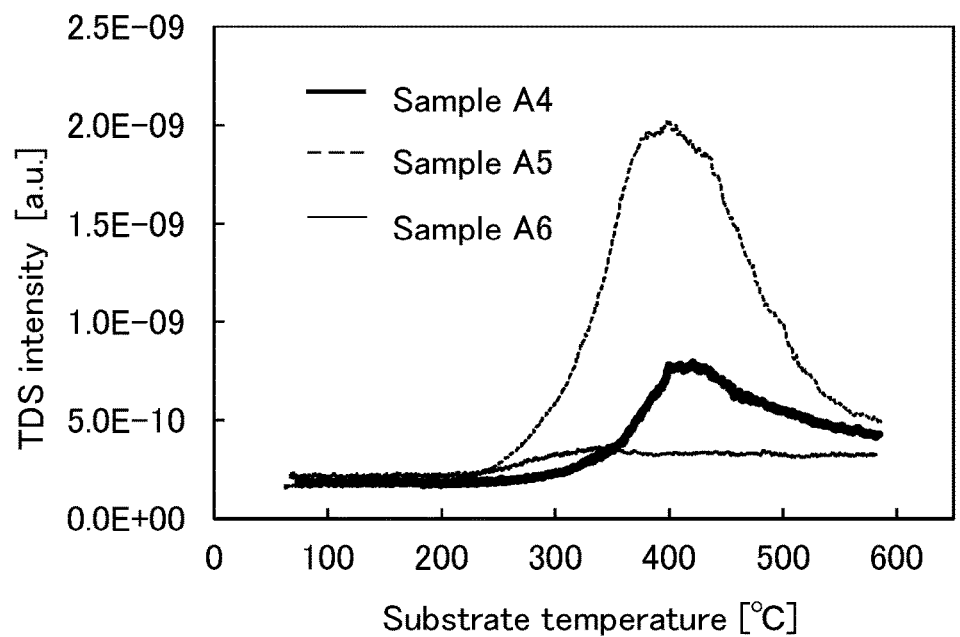
FIG. 18A M/z=2(H$_2$)
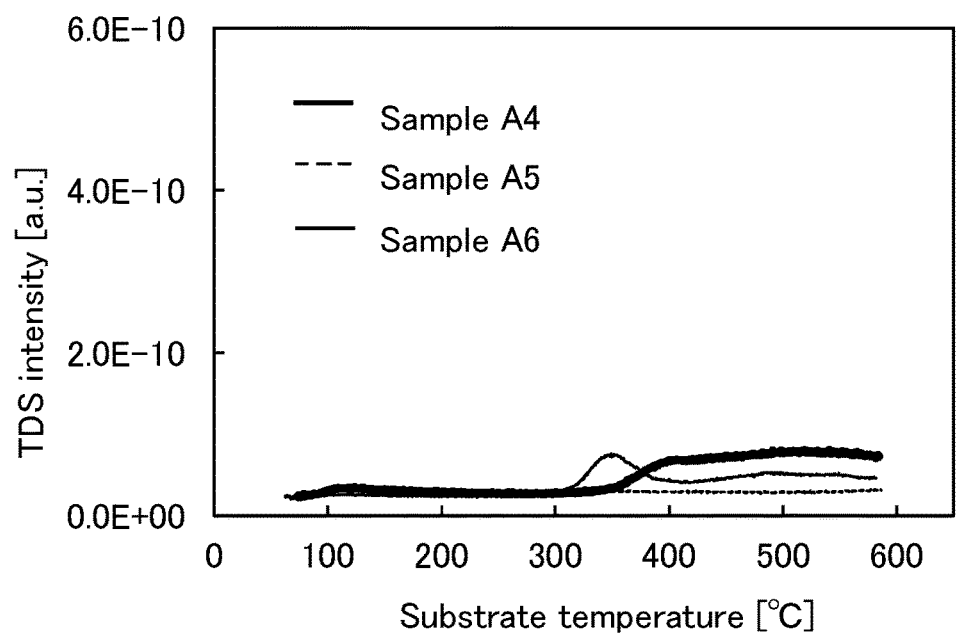
FIG. 18B M/z=18(H$_2$O)

FIG. 19A  M/z=32(O₂)
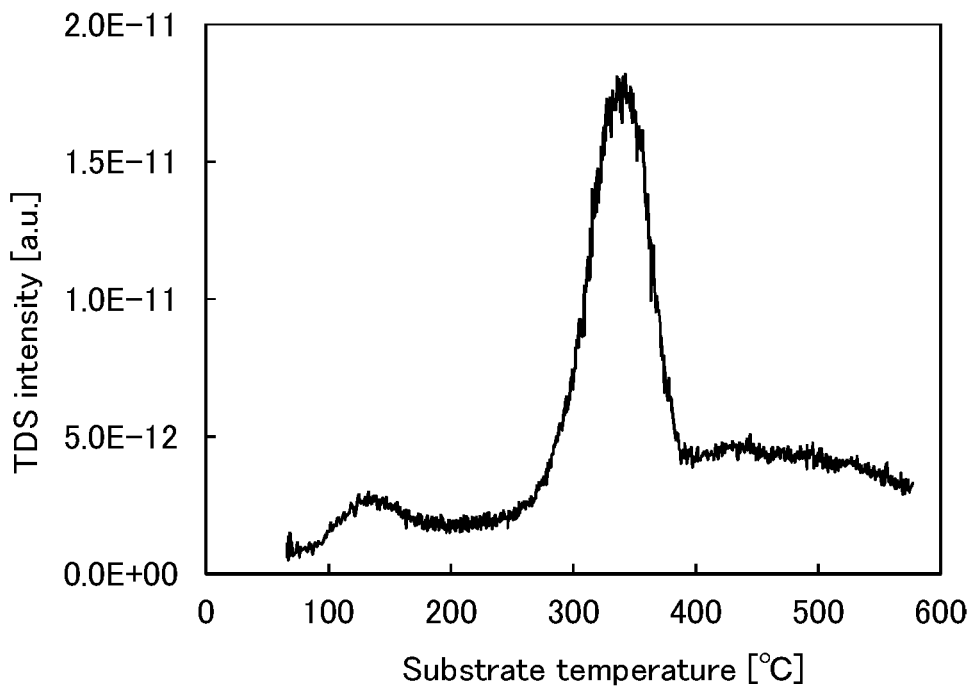
FIG. 19B  M/z=18(H₂O)
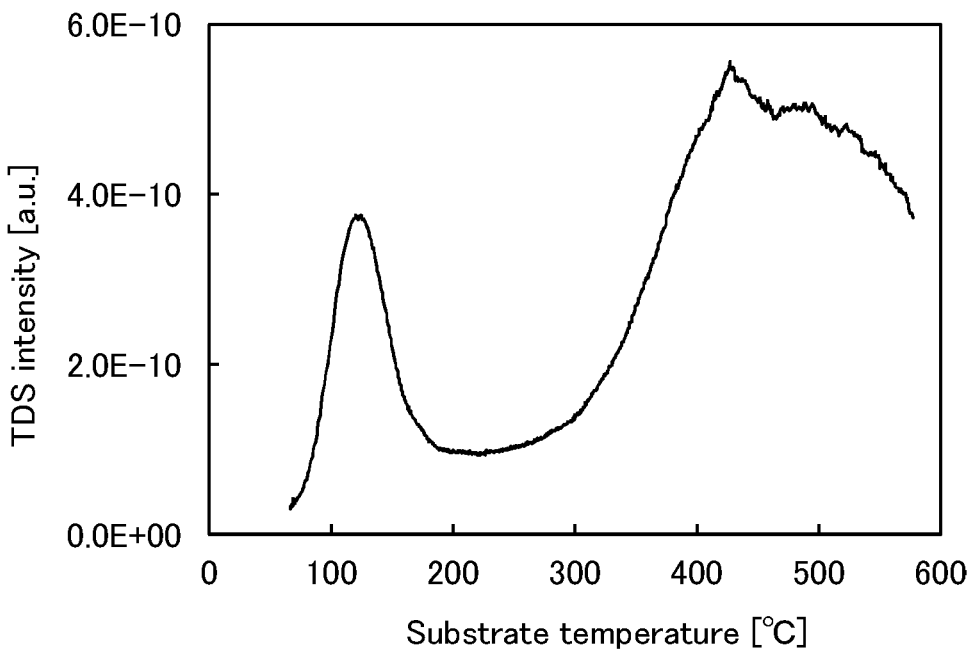

SEMICONDUCTOR DEVICE

TECHNICAL FIELD

The present invention relates to a semiconductor device including a field-effect transistor and a method for manufacturing the semiconductor device.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using the silicon semiconductors are used in integrated circuits (ICs) and the like.

In recent years, a technique in which, instead of a silicon semiconductor, a metal oxide exhibiting semiconductor characteristics is used for transistors has attracted attention. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

Meanwhile, it has been pointed out that hydrogen is a source for supplying carriers particularly in an oxide semiconductor. Therefore, some measures need to be taken to prevent hydrogen from entering the oxide semiconductor at the time of forming the oxide semiconductor. Further, variation in a threshold voltage is suppressed by reducing the amount of hydrogen contained in the oxide semiconductor film or a gate insulating film in contact with the oxide semiconductor (see Patent Document 3).

Further, water is a source for supplying hydrogen. Therefore, by providing a silicon nitride film having a property of blocking water over a transistor including an oxide semiconductor film, entry of water from the outside to the oxide semiconductor film can be prevented.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

DISCLOSURE OF INVENTION

However, nitrogen becomes a source for supplying carriers in a similar manner to hydrogen. Thus, when nitrogen contained in a silicon nitride film enters an oxide semiconductor film, a change in electrical characteristics in a transistor including an oxide semiconductor film, typically, a shift of the threshold voltage in the negative direction occurs. Further, there is a problem in that electrical characteristics vary among transistors.

Thus, an object of one embodiment of the present invention is to suppress movement of hydrogen and nitrogen to an oxide semiconductor film in a transistor including an oxide semiconductor film. It is another object of one embodiment of the present invention to suppress a change in electrical characteristics and to improve reliability in a semiconductor device using a transistor including an oxide semiconductor.

One embodiment of the present invention includes a transistor including an oxide semiconductor film and a nitride insulating film provided over the transistor, and an amount of hydrogen molecules released from the nitride insulating film by heating is smaller than $5 \times 10^{21}$ molecules/$cm^3$, preferably smaller than or equal to $3 \times 10^{21}$ molecules/$cm^3$, more preferably smaller than or equal to $1 \times 10^{21}$ molecules/$cm^3$, and an amount of ammonia molecules released from the nitride insulating film by heating is smaller than $1 \times 10^{22}$ molecules/$cm^3$, preferably smaller than or equal to $5 \times 10^{21}$ molecules/$cm^3$, more preferably smaller than or equal to $1 \times 10^{21}$ molecules/$cm^3$.

Another embodiment of the present invention includes a gate electrode, an oxide semiconductor film overlapping with a part of the gate electrode with a gate insulating film provided therebetween, a pair of electrodes in contact with the oxide semiconductor film, and a nitride insulating film provided over the oxide semiconductor film. An amount of hydrogen molecules released from the nitride insulating film by heating is smaller than $5 \times 10^{21}$ molecules/$cm^3$, preferably smaller than or equal to $3 \times 10^{21}$ molecules/$cm^3$, more preferably smaller than or equal to $1 \times 10^{21}$ molecules/$cm^3$, and an amount of ammonia molecules released from the nitride insulating film by heating is smaller than $1 \times 10^{22}$ molecules/$cm^3$, preferably smaller than or equal to $5 \times 10^{21}$ molecules/$cm^3$, more preferably smaller than or equal to $1 \times 10^{21}$ molecules/$cm^3$.

Another embodiment of the present invention includes a nitride insulating film as a gate insulating film in a transistor including an oxide semiconductor film. An amount of hydrogen molecules released from the nitride insulating film by heating is smaller than $5 \times 10^{21}$ molecules/$cm^3$, preferably smaller than or equal to $3 \times 10^{21}$ molecules/$cm^3$, more preferably smaller than or equal to $1 \times 10^{21}$ molecules/$cm^3$, and an amount of ammonia molecules released from the nitride insulating film by heating is smaller than $1 \times 10^{22}$ molecules/$cm^3$, preferably smaller than or equal to $5 \times 10^{21}$ molecules/$cm^3$, more preferably smaller than or equal to $1 \times 10^{21}$ molecules/$cm^3$.

Another embodiment of the present invention includes an oxide semiconductor film, a pair of electrodes in contact with the oxide semiconductor film, a gate insulating film provided over at least the oxide semiconductor film, and a gate electrode overlapping with a part of the oxide semiconductor film with the gate insulating film provided therebetween. The gate insulating film includes a nitride insulating film. An amount of hydrogen molecules released from the nitride insulating film by heating is smaller than $5 \times 10^{21}$ molecules/$cm^3$, preferably smaller than or equal to $3 \times 10^{21}$ molecules/$cm^3$, more preferably smaller than or equal to $1 \times 10^{21}$ molecules/$cm^3$, and an amount of ammonia molecules released from the nitride insulating film by heating is smaller than $1 \times 10^{22}$ molecules/$cm^3$, preferably smaller than or equal to $5 \times 10^{21}$ molecules/$cm^3$, more preferably smaller than or equal to $1 \times 10^{21}$ molecules/$cm^3$.

A nitride insulating film which releases hydrogen molecules less than $5 \times 10^{21}$ molecules/$cm^3$, preferably less than or equal to $3 \times 10^{21}$ molecules/$cm^3$, more preferably less than or equal to $1 \times 10^{21}$ molecules/$cm^3$, and ammonia molecules less than $1 \times 10^{22}$ molecules/$cm^3$, preferably less than or equal to $5 \times 10^{21}$ molecules/$cm^3$, more preferably less than or equal to $1 \times 10^{21}$ molecules/$cm^3$ by heating is provided over a transistor including an oxide semiconductor film, whereby the amount of hydrogen and nitrogen which are moved from the nitride insulating film to the oxide semiconductor film can be reduced. Further, entry of hydrogen contained in water to the oxide semiconductor film from the outside can be suppressed.

Further, as a gate insulating film of a transistor including an oxide semiconductor film, a nitride insulating film which releases hydrogen molecules less than $5\times10^{21}$ molecules/$cm^3$, preferably less than or equal to $3\times10^{21}$ molecules/$cm^3$, more preferably less than or equal to $1\times10^{21}$ molecules/$cm^3$, and ammonia molecules less than $1\times10^{22}$ molecules/$cm^3$, preferably less than or equal to $5\times10^{21}$ molecules/$cm^3$, more preferably less than or equal to $1\times10^{21}$ molecules/$cm^3$ by heating is provided, whereby the amount of hydrogen and nitrogen which are moved from the nitride insulating film to the oxide semiconductor film can be reduced. Further, entry of hydrogen contained in water to the oxide semiconductor film from the outside can be suppressed.

With one embodiment of the present invention, a change in electrical characteristics of a transistor including an oxide semiconductor film is suppressed and reliability can be improved.

BRIEF DESCRIPTION OF DRAWINGS

In the accompanying drawings:
FIGS. 16A to 16C show results of TDS analysis;
FIGS. 17A and 17B show results of TDS analysis;
FIGS. 18A and 18B show results of TDS analysis;
FIGS. 19A and 19B show results of TDS analysis.

BEST MODE FOR CARRYING OUT THE INVENTION

Figure 1A:
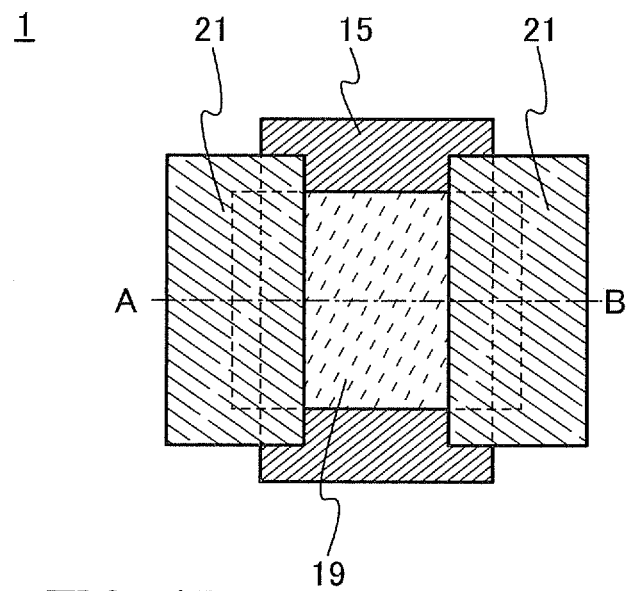
FIGS. 1A and 1B are diagrams illustrating one embodiment of a transistor.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between potential of one point and reference potential (e.g., ground potential) is merely called potential or voltage, and potential and voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

(Embodiment 1)

In this embodiment, a semiconductor device of one embodiment of the present invention and a method for manufacturing the semiconductor device is described with reference to drawings.

Figure 1B:
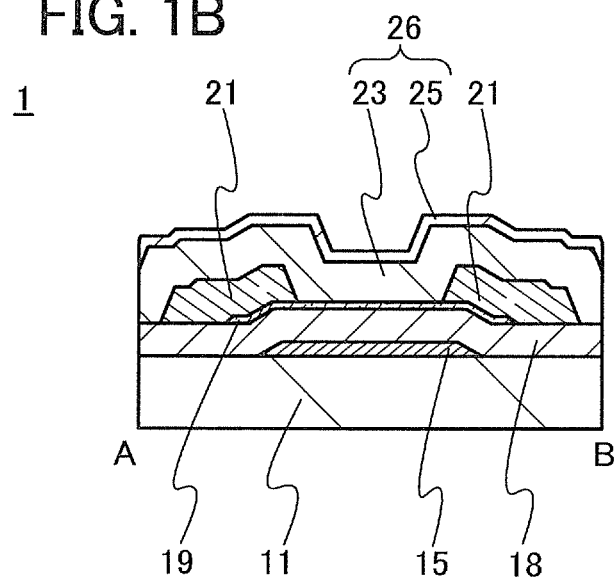

FIGS. 1A and 1B are a top view and a cross-sectional view of a transistor 1 included in a semiconductor device. FIG 1A is a top view of the transistor 1 and FIG. 1B is a cross-sectional view taken along dashed-dotted line A-B in FIG. 1A. Note that in FIG. 1A, a substrate 11, some components of the transistor 1 (e.g., a gate insulating film 18), an insulating film 23, a nitride insulating film 25, and the like are omitted for simplicity.

The transistor 1 illustrated in FIGS. 1A and 1B includes a gate electrode 15 provided over the substrate 11, the gate insulating film 18 formed over the substrate 11 and the gate electrode 15, an oxide semiconductor film 19 overlapping with the gate electrode 15 with the gate insulating film 18 provided therebetween, and a pair of electrodes 21 in contact with the oxide semiconductor film 19. A protective film 26 including the insulating film 23 and the nitride insulating film 25 is formed over the gate insulating film 18, the oxide semiconductor film 19, and the pair of electrodes 21.

The nitride insulating film 25 provided over the transistor 1 in this embodiment releases hydrogen molecules less than $5\times10^{21}$ molecules/cm$^3$, preferably less than or equal to $3\times10^{21}$ molecules/cm$^3$, more preferably less than or equal to $1\times10^{21}$ molecules/cm$^3$, and ammonia molecules less than $1\times10^{22}$ molecules/cm$^3$, preferably less than or equal to $5\times10^{21}$ molecules/cm$^3$, more preferably less than or equal to $1\times10^{21}$ molecules/cm$^3$ by thermal desorption spectroscopy (TDS). The number of hydrogen molecules and the number of ammonia molecules which are sources for supplying nitrogen, which are released from the nitride insulating film 25, are small; thus, the amount of hydrogen and nitrogen which are moved to the oxide semiconductor film 19 in the transistor 1 is small.

Hydrogen contained in the oxide semiconductor film 19 reacts with oxygen bonded to a metal atom to produce water, and a defect is formed in a lattice from which oxygen is released (or a portion from which oxygen is released). In addition, part of hydrogen reacts with oxygen, which causes generation of electrons serving as carriers. Further, nitrogen contained in the oxide semiconductor film 19 reacts with a metal element or oxygen, which causes generation of electrons serving as carriers. As a result, a transistor including the oxide semiconductor film 19 tends to be normally on. Therefore, hydrogen and nitrogen in the oxide semiconductor film 19 are reduced as much as possible, whereby a shift of the threshold voltage in the negative direction can be suppressed and variation in electrical characteristics can be reduced. Further, leakage current between a source and a drain of the transistor, typically off-state current, can be reduced.

A nitride insulating film which releases hydrogen molecules less than $5\times10^{21}$ molecules/cm$^3$, preferably less than or equal to $3\times10^{21}$ molecules/cm$^3$, more preferably less than or equal to $1\times10^{21}$ molecules/cm$^3$, and ammonia molecules less than $1\times10^{22}$ molecules/cm$^3$, preferably less than or equal to $5\times10^{21}$ molecules/cm$^3$, more preferably less than or equal to $1\times10^{21}$ molecules/cm$^3$ by thermal desorption spectroscopy is provided over the transistor 1, whereby the amount of hydrogen and ammonia which are moved from the nitride insulating film to the oxide semiconductor film 19 can be small and concentration of hydrogen and nitrogen in the oxide semiconductor film 19 can be reduced. Further, the nitride insulating film 25 is provided over the transistor 1; therefore, entry of water from the outside to the oxide semiconductor film 19 can be suppressed. In other words, entry of hydrogen contained in water to the oxide semiconductor film 19 can be suppressed. As a result, a shift of the threshold voltage in the negative direction can be suppressed and variation in electrical characteristics can be reduced. Further, leakage current between a source and a drain of the transistor, typically off-state current, can be reduced.

As the nitride insulating film 25, silicon nitride, silicon nitride oxide, aluminum nitride, aluminum nitride oxide, or the like with a thickness greater than or equal to 50 nm and less than or equal to 200 nm can be used. Note that in this specification, a "silicon oxynitride film" refers to a film that contains more oxygen than nitrogen, and a "silicon nitride oxide film" refers to a film that contains more nitrogen than oxygen. Further, an "aluminum oxynitride film" refers to a film that contains more oxygen than nitrogen, and an "aluminum nitride oxide film" refers to a film that contains more nitrogen than oxygen.

Here, a method to measure the number of released hydrogen molecules and released ammonia molecules using thermal desorption spectroscopy (hereinafter, referred to as TDS analysis) is described below.

The amount of released gas in the TDS analysis is proportional to an integral value of spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of the released hydrogen molecules ($N_{H2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 2 which are obtained by the TDS analysis are assumed to originate from an hydrogen molecule. Further, an isotope of a hydrogen atom having a mass number other than 1 is not taken into consideration because the proportion of such a molecule in the natural world is minimal

[FORMULA 1]

$$N_{H2} = \frac{N_{H2(S)}}{S_{H2(S)}} \times S_{H2} \times \alpha \qquad (1)$$

$N_{H2}$ is the number of the released hydrogen molecules. $N_{H2(S)}$ is the value obtained by conversion of the number of hydrogen molecules desorbed from the standard sample into densities. $S_{H2(S)}$ is the integral value of a spectrum when the standard sample is subjected to TDS analysis. Here, the reference value of the standard sample is set to $N_{H2(S)}/S_{H2(S)}$. $S_{H2}$ is the integral value of a spectrum when the insulating film is subjected to TDS analysis. α is a coefficient affecting the intensity of the spectrum in the TDS analysis. Refer to Japanese Published Patent Application No. H6-275697 for details of Formula 1. Note that the number of released hydrogen molecules from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in Formula 1, an integral value of spectrum when the number of released ammonia molecules from an insulating film is measured by the TDS analysis is substituted into $S_{H2}$, whereby the number of released ammonia molecules can be obtained.

Other details of the transistor 1 are described below.

There is no particular limitation on the property of a material and the like of the substrate 11 as long as the material has heat resistance enough to withstand at least later heat treatment. For example, a glass substrate, a ceramic substrate, a quartz substrate, a sapphire substrate, or the like may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 11. Furthermore, any of these substrates further provided with a semiconductor element may be used as the substrate 11.

Still alternatively, a flexible substrate may be used as the substrate 11, and the transistor 1 may be provided directly on the flexible substrate. Alternatively, a separation layer may be provided between the substrate 11 and the transistor 1. The separation layer can be used when part or the whole of a semiconductor device formed over the separation layer is separated from the substrate 11 and transferred onto another substrate. In such a case, the transistor 1 can move to a substrate having low heat resistance or a flexible substrate as well.

The base insulating film may be provided between the substrate 11 and the gate electrode 15. As the base insulating film, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film, it is possible to suppress diffusion of impurities, typically, an alkali metal, water, hydrogen, and the like, into the oxide semiconductor film 19 from the substrate 11.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. Further, the gate electrode 15 may have a single-layer structure or a stacked-layer structure of two or more layers. A single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order can be given as examples. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide including silicon oxide. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a metal nitride film (such as an InN film or a ZnN film), or the like may be provided between the gate electrode 15 and the gate insulating film 18. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 19, specifically, an In—Ga—Zn-based oxynitride semiconductor film having a nitrogen concentration higher than or equal to 7 at. %, is used.

The gate insulating film 18 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. Note that in order to improve the characteristics of the interface between the gate insulating film 18 and the oxide semiconductor film 19, a region in the gate insulating film 18 which is in contact with at least the oxide semiconductor film 19 is preferably formed using an oxide insulating film.

It is possible to prevent outward diffusion of oxygen from the oxide semiconductor film 19 and entry of hydrogen, water, or the like into the oxide semiconductor film 19 from the outside by providing an insulating film having a blocking effect against oxygen, hydrogen, water, and the like for the gate insulating film 18. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

Further, the gate insulating film 18 has a stacked structure in which a first silicon nitride film is formed using a silicon nitride film having fewer defects, a second silicon nitride film using a silicon nitride film which releases the small number of hydrogen molecules and ammonia molecules as the nitride insulating film 25 is formed over the first silicon nitride film, and an oxide insulating film is formed over the second silicon nitride film, whereby the gate insulating film 18 can be formed using a gate insulating film which has fewer defects and releases the small number of hydrogen molecules and ammonia molecules. As a result, movement of hydrogen and nitrogen contained in the gate insulating film 18 to the oxide semiconductor film 19 can be suppressed.

By using a silicon nitride film as the gate insulating film 18, the following effect can be obtained. The silicon nitride film has a higher relative permittivity than a silicon oxide film and needs a larger thickness for an equivalent capacitance. Thus, the physical thickness of the gate insulating film can be increased. This makes it possible to suppress a decrease in withstand voltage of the transistor 1 and furthermore improve the withstand voltage, thereby suppressing electrostatic discharge damage to a semiconductor device.

Further, in the case where copper is used for the gate electrode 15 and a silicon nitride film is used as the gate insulating film 18 in contact with the gate electrode 15, as the gate insulating film 18, a silicon nitride film releasing ammonia molecules by heating, which are reduced as much as possible, is preferably used. Thus, as the silicon nitride film, a silicon nitride film which can be used as the nitride insulating film 25 can be used. As a result, reaction between copper and ammonia molecules can be suppressed.

In the case where the trap level (also referred to as interface level) is present at the interface between an oxide semiconductor film and a gate insulating film or in the gate insulating film in a transistor using an oxide semiconductor, a shift of the threshold voltage of the transistor, typically, a shift of the threshold voltage in the negative direction, and an increase in the subthreshold swing (S value) showing a gate voltage needed for changing the drain current by one digit when the transistor is turned on are caused. As a result, there is a problem in that electrical characteristics vary among transistors. Therefore, by using a silicon nitride film having fewer defects is used as a gate insulating film, a shift of the threshold voltage in the negative direction and variation in electrical characteristics of the transistor can be reduced.

The gate insulating film 18 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 18 is preferably greater than or equal to 5 nm and less than or equal to 400 nm, more preferably greater than or equal to 10 nm and less than or equal to 300 nm, still more preferably greater than or equal to 50 nm and less than or equal to 250 nm The oxide semiconductor film 19 preferably contains at least indium (In) or zinc (Zn). Alternatively, the oxide semiconductor film 19 preferably contains both In and Zn. In order to reduce variation in electrical characteristics of the transistors including the oxide semiconductor film 19, the oxide semiconductor film 19 preferably contains one or more of stabilizers in addition to In or Zn.

As for stabilizers, gallium (Ga), tin (Sn), hafnium (Hf), aluminum (Al), zirconium (Zr), and the like can be given. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and the like can be given.

As the oxide semiconductor, for example, the following can be used: indium oxide, tin oxide; zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as an IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In-Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or any of oxides whose composition is in the neighborhood of the above compositions. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8) may be used. Note that a proportion of each atom in the atomic ratio of the metal oxide varies within a range of ±20% as an error.

However, the composition is not limited to those described above, and a material having the appropriate composition may be used depending on needed semiconductor characteristics and electrical characteristics (e.g., field-effect mobility, threshold voltage, and variation). In order to obtain needed semiconductor characteristics, it is preferable that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk also in the case where the In—Ga—Zn-based metal oxide is used.

Note that the energy gap of a metal oxide that can form the oxide semiconductor film 19 is 2 eV or more, preferably 2.5 eV or more, further preferably 3 eV or more. In this manner, the off-state current of a transistor can be reduced by using an oxide semiconductor having a wide energy gap.

Note that the oxide semiconductor film 19 may have an amorphous structure, a single crystal structure, or a polycrystalline structure.

As the oxide semiconductor film 19, a c-axis aligned crystalline oxide semiconductor film (also referred to as a CAAC-OS film) having crystal parts may be used.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to the normal vector of the formation surface or the normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, a change in electrical characteristics due to irradiation with visible light or ultraviolet light is small. Thus, the transistor has high reliability.

Alternatively, the oxide semiconductor film 19 may have a stacked-layer structure of a plurality of oxide semiconductor films. For example, the oxide semiconductor film 19 may have a stacked-layer structure of a first oxide semiconductor film and a second oxide semiconductor film which are formed using metal oxides with different compositions. Alternatively, for example, the first oxide semiconductor film may be formed using any of a two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the composition of the constituent elements of the first oxide semiconductor film and the second oxide semiconductor film may be made different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor varies within a range of ±20% as an error.

At this time, one of the first oxide semiconductor film and the second oxide semiconductor film, which is closer to the gate electrode (on the channel side), preferably contains In and Ga at a proportion of In>Ga. The other oxide semiconductor film, which is farther from the gate electrode (on the back channel side) preferably contains In and Ga at a proportion of In≤Ga.

Further, the oxide semiconductor film 19 may have a three-layer structure of a first oxide semiconductor film, a second oxide semiconductor film, and a third oxide semiconductor film, in which the constituent elements thereof is made the same and the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

As compared to an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film, an oxide semiconductor film which contains less In than Ga and Zn at an atomic ratio, typically, the first oxide semiconductor film containing In, Ga, and Zn at an atomic ratio of 1:3:2, has few oxygen vacancies, and thus can suppress an increase in carrier density. Further, when the first oxide semiconductor film containing In, Ga, and Zn at an atomic ratio of 1:3:2 has an amorphous structure, the second oxide semiconductor film is likely to be a CAAC-OS film.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film 19 has the above structure, the amount of change in threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion of In>Ga has higher carrier mobility than an oxide containing In and Ga at a proportion of In≤Ga. Further, in Ga, the formation energy of an oxygen vacancy is larger and thus an oxygen vacancy is less likely to occur, than in In; therefore, the oxide containing In and Ga at a proportion of In≤Ga has more stable characteristics than the oxide containing In and Ga at a proportion of In>Ga.

An oxide semiconductor containing In and Ga at a proportion of In>Ga is used on the channel side, and an oxide semiconductor containing In and Ga at a proportion of In≤Ga is used on the back channel side, so that the field-effect mobility and the reliability of the transistor can be further improved.

Further, the first oxide semiconductor film, the second oxide semiconductor film, and the third oxide semiconductor film may be formed using oxide semiconductors having different crystallinity. That is, these oxide semiconductor films may be formed using any of a single crystal oxide semiconductor, a polycrystalline oxide semiconductor, an amorphous oxide semiconductor, and a CAAC-OS, as appropriate. When an amorphous oxide semiconductor is used for either the first oxide semiconductor film or the second oxide semiconductor film, internal stress or external stress of the oxide semiconductor film 19 is relieved, variation in characteristics of the transistor is reduced, and the reliability of the transistor can be further improved.

The thickness of the oxide semiconductor film 19 is preferably greater than or equal to 1 nm and less than or equal to 100 nm, more preferably greater than or equal to 1 nm and less than or equal to 30 nm, still more preferably greater than or equal to 1 nm and less than or equal to 50 nm, further preferably greater than or equal to 3 nm and less than or equal to 20 nm The concentration of alkali metals or alkaline earth metals in the oxide semiconductor film 19, which is obtained by secondary ion mass spectrometry (SIMS), is preferably lower than or equal to $1 \times 10^{18}$ atoms/cm$^3$, more preferably lower than or equal to $2 \times 10^{16}$ atoms/cm$^3$. This is because, when alkali metals or alkaline earth metals are bonded to an oxide semiconductor, some of the alkali metals or the alkaline earth metals generate carriers and cause an increase in the off-state current of the transistor.

In the oxide semiconductor film 19, the hydrogen concentration obtained by secondary ion mass spectrometry is preferably smaller than $5 \times 10^{18}$ atoms/cm$^3$, further preferably smaller than or equal to $1 \times 10^{18}$ atoms/cm$^3$, still further preferably smaller than or equal to $5 \times 10^{17}$ atoms/cm$^3$, yet still further preferably smaller than or equal to $1 \times 10^{16}$ atoms/cm$^3$.

Hydrogen contained in the oxide semiconductor film 19 reacts with oxygen bonded to a metal atom to produce water, and a defect is formed in a lattice from which oxygen is released (or a portion from which oxygen is removed). In addition, a bond of part of hydrogen and oxygen causes generation of electrons serving as a carrier. Thus, the impurities containing hydrogen are reduced as much as possible in the step of forming the oxide semiconductor film, whereby the hydrogen concentration in the oxide semiconductor film can be reduced. Therefore, an oxide semiconductor film in which hydrogen is removed as much as possible is used in a channel formation region, whereby a shift of the threshold voltage in the negative direction can be suppressed and variation in electrical characteristics can be reduced. Further, leakage current between a source and a drain of the transistor, typically off-state current, can be reduced.

In addition, the nitrogen concentration in the oxide semiconductor film 19 is set to be lower than or equal to $5 \times 10^{18}$ atoms/cm$^3$, whereby a shift of the threshold voltage in the negative direction can be suppressed and variation in electrical characteristics can be reduced.

Various experiments can prove low off-state current of a transistor including a highly-purified oxide semiconductor film from which hydrogen is removed as much as possible as a channel formation region. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it can be seen that the off-state current is 100 zA/μm or lower. Further, the off-state current was measured with the use of a circuit in which a capacitor and a transistor are connected to each other and charge that flows in or out from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Consequently, the transistor including the highly purified oxide semiconductor film as the channel formation region has extremely small off-state current.

The pair of electrodes 21 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

Although the pair of electrodes 21 is provided between the oxide semiconductor film 19 and the insulating film 23 in this embodiment, the pair of electrodes 21 may be provided between the gate insulating film 18 and the oxide semiconductor film 19.

In order to improve the characteristics of the interface between the insulating film 23 and the oxide semiconductor film 19, an oxide insulating film is preferably used as the insulating film 23. As the insulating film 23, silicon oxide, silicon oxynitride, aluminum oxide, hafnium oxide, gallium oxide, Ga—Zn-based metal oxide, or the like with a thickness more than or equal to 150 nm and less than or equal to 400 nm can be used.

Next, a method for manufacturing the transistor 1 illustrated in FIGS. 1A and 1B is described with reference to FIGS. 2A to 2D.

Figure 2A:
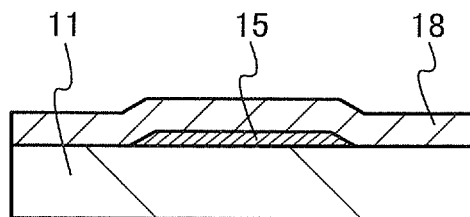
FIGS. 2A to 2D are cross-sectional views illustrating one embodiment of a method for manufacturing a transistor.

As illustrated in FIG. 2A, the gate electrode 15 is formed over the substrate 11, and the gate insulating film 18 is formed over the gate electrode 15.

A formation method of the gate electrode 15 is described below. First, a conductive film is formed by a sputtering method, a CVD method, an evaporation method, or the like and then a mask is formed over the conductive film by a photolithography process. Then, part of the conductive film is etched using the mask to form the gate electrode 15. After that, the mask is removed.

Note that instead of the above formation method, the gate electrode 15 may be formed by an electrolytic plating method, a printing method, an ink-jet method, or the like.

Here, a 100-nm-thick tungsten film is formed by a sputtering method. Then, a mask is formed by a photolithography process and the tungsten film is dry-etched using the mask to form the gate electrode 15.

The gate insulating film 18 is formed by a sputtering method, a CVD method, an evaporation method, or the like.

In the case where the gate insulating film 18 is formed using a silicon oxide film or a silicon oxynitride film, a deposition gas containing silicon and an oxidizing gas are preferably used as a source gas. As typical examples of the deposition gas containing silicon, silane, disilane, trisilane, and silane fluoride can be given. As the oxidizing gas, oxygen, ozone, dinitrogen monoxide, nitrogen dioxide, and the like can be given as examples.

Further, in the case where a stacked structure of a silicon nitride film and an oxide insulating film is formed as the gate insulating film 18, the silicon nitride film is preferably stacked by a two-step formation method. First, a first silicon nitride film with few defects is formed by a plasma CVD method in which a mixed gas of silane, nitrogen, and ammonia is used as a source gas. Then, by using a source gas at a flow rate ratio which is similar to that of a source gas used for the nitride insulating film 25 described later, a silicon nitride film which releases the small number of hydrogen molecules and ammonia molecules can be formed as the second silicon nitride film. With such a formation method, a silicon nitride film which has few defects and releases the small number of hydrogen molecules and ammonia molecules can be formed as the gate insulating film 18.

Moreover, in the case where a gallium oxide film is formed as the gate insulating film 18, a metal organic chemical vapor deposition (MOCVD) method can be used.

Here, by a plasma CVD method, the gate insulating film 18 in which the first silicon nitride film with a thickness of 300 nm, the second silicon nitride film with a thickness of 50 nm, and the silicon oxynitride film with a thickness of 50 nm are stacked is formed.

Figure 2B:
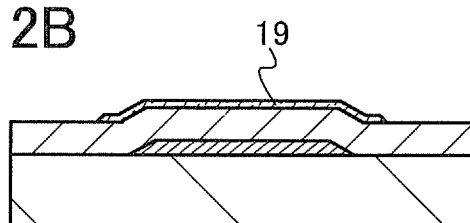

Next, as illustrated in FIG. 2B, an oxide semiconductor film 19 is formed over the gate insulating film 18.

A formation method of the oxide semiconductor film 19 is described below. An oxide semiconductor film is formed over the gate insulating film 18 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 19 which is over the gate insulating film 18 and subjected to element isolation so as to partly overlap with the gate electrode 15 is formed as illustrated in FIG. 2B. After that, the mask is removed.

Alternatively, by using a printing method for forming the oxide semiconductor film 19, the oxide semiconductor film 19 subjected to element isolation can be formed directly.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

A CAAC-OS film is formed by, for example, a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be deposited.

For the deposition of the CAAC-OS film, the following conditions are preferably used.

By suppressing the number of impurities entering the CAAC-OS film during the deposition, the crystal state can be prevented from being broken by the impurities. For example, reducing the concentration of impurities (e.g., hydrogen, water, carbon dioxide, and nitrogen) which exist in the deposition chamber is favorable. Furthermore, the concentration of impurities in a deposition gas can be reduced. Specifically, a deposition gas whose dew point is lower than or equal to −80° C., preferably lower than or equal to −100° C., can be used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than the strain point of the substrate, preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn-based metal oxide target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, after the oxide semiconductor film is formed, heat treatment may be performed so that the oxide semiconductor film is subjected to dehydrogenation or dehydration. The heating temperature is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By performing heat treatment after the oxide semiconductor film is formed, in the oxide semiconductor film, the concentration of hydrogen can be smaller than $5\times10^{18}$ atoms/cm$^3$, preferably smaller than or equal to $1\times10^{18}$ atoms/cm$^3$, further preferably smaller than or equal to $5\times10^{17}$ atoms/cm$^3$, still further preferably smaller than or equal to $1\times10^{16}$ atoms/cm$^3$.

Here, a 35-nm-thick oxide semiconductor film is formed by a sputtering method, a mask is formed over the oxide semiconductor film, and then part of the oxide semiconductor film is selectively etched. Next, after the mask is removed, heat treatment is performed in an atmosphere of nitrogen and oxygen, so that the oxide semiconductor film 19 is formed.

Figure 2C:
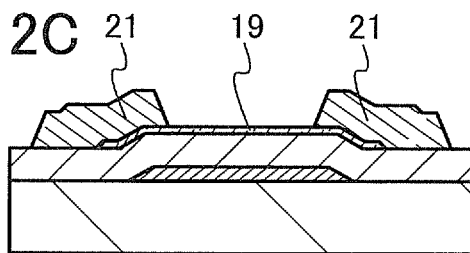

Next, as illustrated in FIG. 2C, the pair of electrodes 21 is formed.

A formation method of the pair of electrodes 21 is described below. First, a conductive film is formed by a sputtering method, a CVD method, an evaporation method, or the like. Then, a mask is formed over the conductive film by a photolithography process. After that, the conductive film is etched using the mask to form the pair of electrodes 21. Then, the mask is removed.

Here, a 50-nm-thick tungsten film, a 400-nm-thick aluminum film, and a 100-nm-thick titanium film are sequentially stacked by a sputtering method. Then, a mask is formed over the titanium film by a photolithography process and the tungsten film, the aluminum film, and the titanium film are dry-etched using the mask to form the pair of electrodes 21.

Note that heat treatment may be performed after the pair of electrodes 21 is formed. This heat treatment can be performed in a manner similar to that of the heat treatment performed after the oxide semiconductor film 19 is formed.

After the pair of electrodes 21 is formed, cleaning treatment is preferably performed to remove an etching residue. A short circuit of the pair of electrodes 21 can be suppressed by this cleaning treatment. The cleaning treatment can be performed using an alkaline solution such as a tetramethylammonium hydroxide (TMAH) solution; an acidic solution such as a hydrofluoric acid solution or an oxalic acid solution; or water.

Next, the insulating film 23 is formed over the oxide semiconductor film 19 and the pair of electrodes 21. The insulating film 23 can be formed by a sputtering method, a CVD method, an evaporation method, or the like.

Here, as the insulating film 23, a silicon oxide film or a silicon oxynitride film is formed by a plasma CVD method.

Next, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. By the heat treatment, water, hydrogen, and the like contained in the insulating film 23 can be released.

Here, the heat treatment is performed at 350° C. for one hour in an atmosphere of nitrogen and oxygen.

Next, the nitride insulating film 25 is formed over the insulating film 23. The nitride insulating film 25 can be formed by a sputtering method, a CVD method, or the like.

In the case where a silicon nitride film is formed by the plasma CVD method as the nitride insulating film 25, a deposition gas containing silicon, nitrogen, and ammonia is used as the source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, preferably greater than or equal to 10 and less than or equal to 50.

Here, in a reaction chamber of a plasma CVD apparatus, the 50-nm-thick silicon nitride film is formed by a plasma CVD method under the following conditions: silane with a flow rate of 50 sccm, nitrogen with a flow rate of 5000 sccm, and ammonia with a flow rate of 100 sccm are used as a source gas, the pressure in the treatment chamber is 200 Pa, the substrate temperature is 220° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Through the above steps, a protective film 26 including the insulating film 23 and the nitride insulating film 25 which releases the small number of hydrogen molecules and ammonia molecules can be formed.

Next, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Through the above steps, a nitride insulating film which releases the small amount of hydrogen molecules and ammonia molecules can be formed over a transistor including an oxide semiconductor film. Further, a transistor with the improved reliability, in which a change in electrical characteristics is suppressed, can be manufactured.

Note that the structures, methods, and the like described in this embodiment can be used as appropriate in combination with any of the structures, methods, and the like described in the other embodiments and examples.

(Embodiment 2)

In this embodiment, a transistor having a structure different from that of Embodiment 1 will be described with reference to FIGS. 3A and 3B. A transistor 3 shown in this embodiment is a top-gate transistor, which is different from the transistors in Embodiment 1.

Figure 3A:
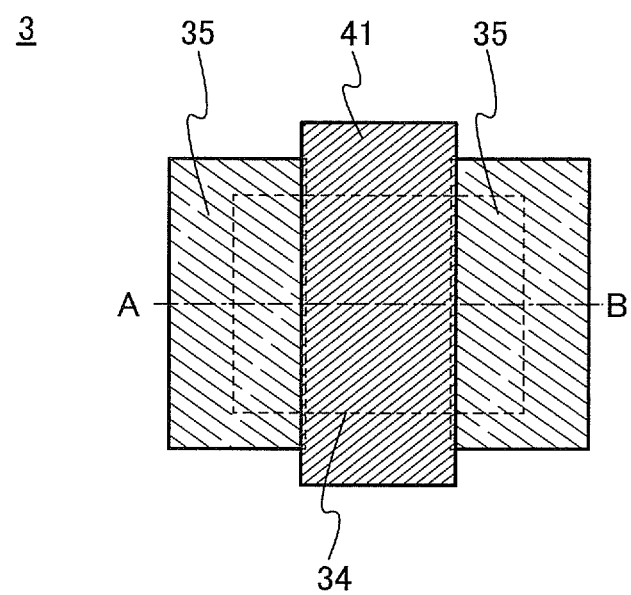
FIGS. 3A and 3B are diagrams illustrating one embodiment of a transistor.
Figure 3B:
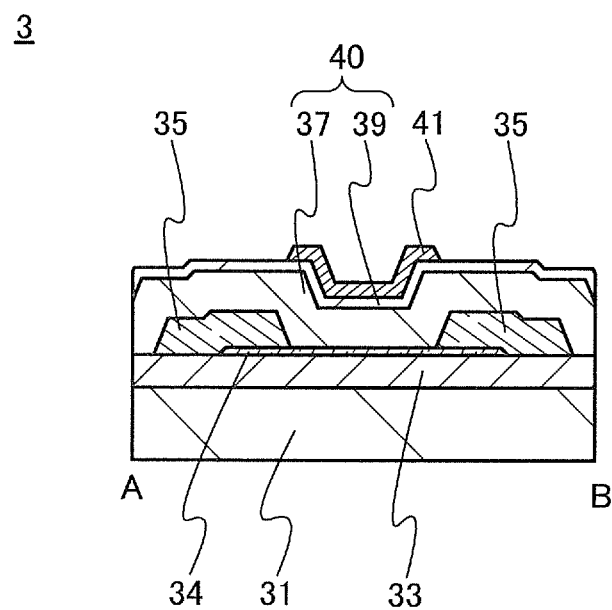

FIGS. 3A and 3B are a top view and a cross-sectional view of the transistor 3. FIG. 3A is a top view of the transistor 3, and FIG. 3B is a cross-sectional view taken along dashed-dotted line A-B in FIG. 3A. Note that in FIG. 3A, a substrate 31, a base insulating film 33, some components of the transistor 3 (e.g., an insulating film 37 and a nitride insulating film 39), and the like are omitted for simplicity.

The transistor 3 illustrated in FIGS. 3A and 3B includes an oxide semiconductor film 34 over the base insulating film 33, a pair of electrodes 35 in contact with the oxide semiconductor film 34, a gate insulating film 40 in contact with the base insulating film 33, the oxide semiconductor film 34, and the pair of electrodes 35, and a gate electrode 41 overlapping with the oxide semiconductor film 34 with the gate insulating film 40 provided therebetween.

The gate insulating film 40 provided in the transistor 3 in this embodiment includes an insulating film 37 and a nitride insulating film 39. As the insulating film 37, the oxide insulating film used as the gate insulating film 18 in Embodiment 1 is used as appropriate, whereby the interface state between the oxide semiconductor film 34 and the gate insulating film 40 can be reduced. As the nitride insulating film 39, a nitride insulating film like the nitride insulating film 25 in Embodiment 1 can be used, which releases hydrogen molecules less than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and ammonia molecules less than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$ by thermal desorption spectroscopy. The number of hydrogen molecules and the number of ammonia molecules which are released from the nitride insulating film 39 are small; thus, the amount of hydrogen and nitrogen which are moved to the oxide semiconductor film 34 in the transistor 3 is small.

As a result, in the transistor 3, the amount of hydrogen and nitrogen which are moved from the gate insulating film 40 to the oxide semiconductor film 34 is small and the concentration of hydrogen and nitrogen in the oxide semiconductor film 34 can be reduced. Further, the nitride insulating film 39 is included in the gate insulating film in the transistor 3, whereby entry of water from the outside to the oxide semiconductor film 34 can be suppressed. In other words, entry of hydrogen contained in water to the oxide semiconductor film 34 can be suppressed. As a result, a shift of the threshold voltage in the negative direction can be suppressed and variation in electrical characteristics can be reduced. Further, leakage current between a source and a drain of the transistor, typically off-state current, can be reduced.

Hereinafter, other details of the transistor 3 will be described.

As the substrate 31, a substrate which is given as an example of the substrate 11 in Embodiment 1 can be used as appropriate.

As the base insulating film 33, an oxide insulating film whose oxygen content is in excess of that in the stoichiometric composition is preferably used. The oxide insulating film whose oxygen content is in excess of that in the stoichiometric composition can diffuse oxygen into an oxide semiconductor film by heat treatment. Typical examples of the base insulating film 33 are films of silicon oxide, silicon oxynitride, silicon nitride oxide, gallium oxide, hafnium oxide, yttrium oxide, aluminum oxide, aluminum oxynitride, and the like.

The thickness of the base insulating film 33 is greater than or equal to 50 nm, preferably greater than or equal to 200 nm and less than or equal to 3000 nm, more preferably greater than or equal to 300 nm and less than or equal to 1000 nm With use of the thick base insulating film 33, the number of oxygen molecules released from the base insulating film 33 can be increased, and the interface state density at the interface between the base insulating film 33 and an oxide semiconductor film formed later can be reduced.

Here, "to release part of oxygen by heating" means that the amount of released oxygen by conversion into oxygen atoms is greater than or equal to $1 \times 10^{18}$ atoms/cm$^3$, preferably greater than or equal to $3 \times 10^{20}$ atoms/cm$^3$ in TDS analysis.

The oxide semiconductor film 34 can be formed in a manner similar to that of the oxide semiconductor film 19 in Embodiment 1.

The pair of electrodes 35 can be formed in a manner similar to that of the pair of electrodes 21 shown in Embodiment 1. Note that the length of the pair of electrodes 35 in the channel width direction is larger than that of the oxide semiconductor film 34, and seen in the cross section in the channel length direction, the pair of electrodes 35 covers end portions of the oxide semiconductor film 34. With such a structure, the area of contact between the pair of electrodes 35 and the oxide semiconductor film 34 is increased. Thus, the contact resistance between the oxide semiconductor film 34 and the pair of electrodes 35 can be reduced, and the on-state current of the transistor can be increased.

In this embodiment, the pair of electrodes 35 is provided between the oxide semiconductor film 34 and the insulating film 37; however, the pair of electrodes 35 may be provided between the base insulating film 33 and the oxide semiconductor film 34.

Further, the insulating film 23 and the nitride insulating film 25 are provided over the gate insulating film 40 and the gate electrode 41 in the same manner as in Embodiment 1, whereby entry of water from the outside to the transistor 3 including the oxide semiconductor film can be further suppressed.

The gate electrode 41 can be formed in a manner similar to that of the gate electrode 15 in Embodiment 1.

Next, a method for manufacturing the transistor illustrated in FIGS. 3A and 3B will be described with reference to FIGS. 4A to 4D.

Figure 4A:
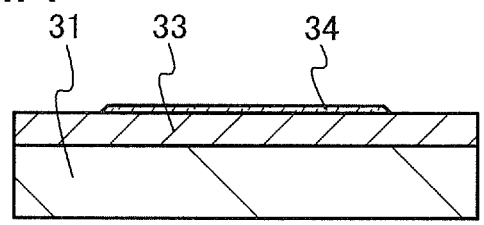
FIGS. 4A to 4D are cross-sectional views illustrating one embodiment of a method for manufacturing a transistor.

As illustrated in FIG. 4A, the base insulating film 33 is formed over the substrate 31. Next, the oxide semiconductor film 34 is formed over the base insulating film 33.

The base insulating film 33 is formed by a sputtering method, a CVD method or the like.

When the oxide insulating film from which part of oxygen is released by heating is formed by a sputtering method as the base insulating film 33, the amount of oxygen in a deposition gas is preferably large, and oxygen, a mixed gas of oxygen and a rare gas, or the like can be used. Typically, the oxygen concentration of a deposition gas is preferably from 6% to 100%.

In the case where an oxide insulating film is formed by a CVD method as the base insulating film 33, hydrogen or water derived from a source gas is sometimes mixed in the oxide insulating film. Thus, after the oxide insulating film is formed by a CVD method, heat treatment is preferably performed as dehydrogenation or dehydration.

In the case of adding oxygen to the oxide insulating film formed by a CVD method, the amount of oxygen released by heating can be increased. As the method for adding oxygen to the oxide insulating film, an ion implantation method, an ion doping method, a plasma immersion ion implantation method, plasma treatment, or the like is used.

The oxide semiconductor film 34 can be formed as appropriate by a formation method similar to that of the oxide semiconductor film 19 described in Embodiment 1.

In order to improve the orientation of the crystal parts in the CAAC-OS film, planarity of the surface of the base insulating film 33 serving as a base insulating film of the oxide semiconductor film is preferably improved. Typically, the base insulating film 33 can be made to have an average surface roughness (Ra) of 1 nm or less, 0.3 nm or less, or 0.1 nm or less. Note that Ra is obtained by expanding, into three dimensions, the arithmetic mean surface roughness defined by JIS B 0601 so that it can be applied to a curved surface, and Ra can be expressed as an "average value of the absolute values of deviations from a reference surface to a specific surface" and is defined by Formula 2.

[FORMULA 2]

$$Ra = \frac{1}{S_0} \int_{y1}^{y2} \int_{x1}^{x2} |f(x, y) - Z_0| dx dy \quad (2)$$

Here, the specific surface is a surface which is a target of roughness measurement, and is a quadrilateral region which is specified by four points represented by the coordinates $(X_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

As planarization treatment for improving planarity of the surface of the base insulating film 33, one or more can be selected from chemical mechanical polishing (CMP) treatment, dry etching treatment, plasma treatment (reverse sputtering), and the like. The plasma treatment is the one in which minute unevenness of the surface is reduced by introducing an inert gas such as an argon gas into a vacuum chamber and applying an electric field so that a surface to be processed serves as a cathode.

Next, heat treatment is preferably performed. By this heat treatment, part of oxygen contained in the base insulating film 33 can be diffused to the vicinity of the interface between the base insulating film 33 and the oxide semiconductor film 34. As a result, the interface state in the vicinity of the interface between the base insulating film 33 and the oxide semiconductor film 34 can be reduced.

The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

Figure 4B:
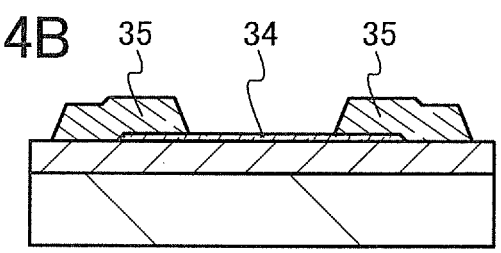

Next, as illustrated in FIG. 4B, the pair of electrodes 35 is formed. The pair of electrodes 35 can be formed as appropriate by a formation method similar to that of the pair of electrodes 21 described in Embodiment 1. Alternatively, the pair of electrodes 35 can be formed by a printing method or an inkjet method.

Figure 4C:
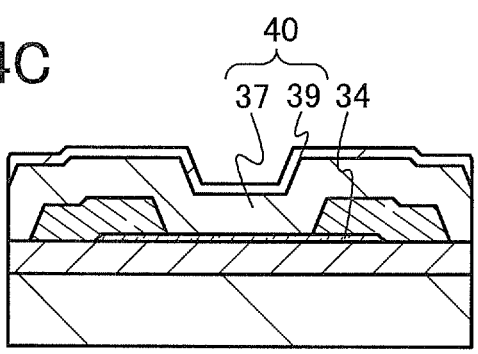

Next, as illustrated in FIG. 4C, the insulating film 37 and the nitride insulating film 39 included in the gate insulating film 40 are formed.

The insulating film 37 is formed by a sputtering method, a CVD method, an evaporation method, or the like.

As the nitride insulating film 39, in a similar manner to the nitride insulating film 25 in Embodiment 1, a nitride insulating film which releases hydrogen molecules less than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and ammonia molecules less than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$ by thermal desorption spectroscopy can be formed.

Figure 4D:
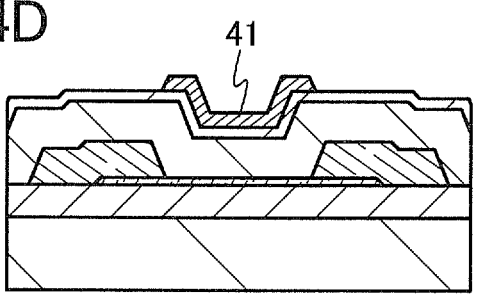

Next, as illustrated in FIG. 4D, the gate electrode 41 is formed over the gate insulating film 40. The gate electrode 41 can be formed as appropriate by a formation method similar to that of the gate electrode 15 in Embodiment 1.

Next, in a manner similar to that in Embodiment 1, heat treatment may be performed. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

Through the above steps, a transistor with the improved reliability, in which a change in electrical characteristics is suppressed, can be manufactured.

Note that the structures, methods, and the like described in this embodiment can be used as appropriate in combination with any of the structures, methods, and the like described in the other embodiments and examples.

(Embodiment 3)

In this embodiment, a transistor having a different structure from the transistors in Embodiment 1 and Embodiment 2 will be described with reference to FIG. 5. A transistor 5 of this embodiment includes a plurality of gate electrodes facing each other with an oxide semiconductor film provided therebetween.

Figure 5:
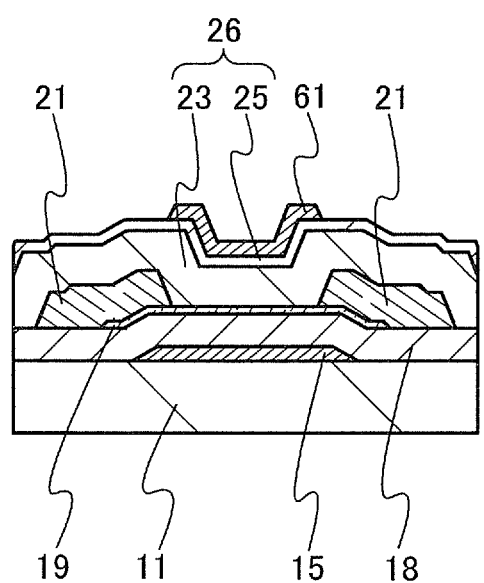
FIG. 5 is a cross-sectional view illustrating one embodiment of a transistor.

The transistor 5 illustrated in FIG. 5 includes the gate electrode 15 provided over the substrate 11, the gate insulating film 18 formed over the substrate 11 and the gate electrode 15, the oxide semiconductor film 19 overlapping with the gate electrode 15 with the gate insulating film 18 provided therebetween, and the pair of electrodes 21 in contact with the oxide semiconductor film 19. The protective film 26 including the insulating film 23 and the nitride insulating film 25 is formed over the gate insulating film 18, the oxide semiconductor film 19, and the pair of electrodes 21. Further, a gate electrode 61 overlapping with the oxide semiconductor film 19 with the protective film 26 provided therebetween is included.

The gate electrode 61 can be formed in a manner similar to that of the gate electrode 15 in Embodiment 1.

The transistor 5 of this embodiment has the gate electrode 15 and the gate electrode 61 facing each other with the oxide semiconductor film 19 provided therebetween. By application of different potentials to the gate electrode 15 and the gate electrode 61, the threshold voltage of the transistor 5 can be controlled. Alternatively, when the same potential is applied to the gate electrode 15 and the gate electrode 61, the on-state current of the transistor 5 can be increased. A nitride insulating film which releases hydrogen molecules less than $5 \times 10^{21}$ molecules/cm$^3$, preferably less than or equal to $3 \times 10^{21}$ molecules/cm$^3$, more preferably less than or equal to $1 \times 10^{21}$ molecules/cm$^3$, and ammonia molecules less than $1 \times 10^{22}$ molecules/cm$^3$, preferably less than or equal to $5 \times 10^{21}$ molecules/cm$^3$, more preferably less than or equal to $1 \times 10^{21}$ molecules/cm$^3$ by thermal desorption spectroscopy is provided between the oxide semiconductor film 19 and the gate electrode 61, whereby the amount of hydrogen and ammonia which are moved from the nitride insulating film to the oxide semiconductor film 19 can be small and concentration of hydrogen and nitrogen in the oxide semiconductor film 19 can be reduced. Further, the nitride insulating film 25 is provided between the oxide semiconductor film 19 and the gate electrode 61; therefore, entry of water from the outside to the oxide semiconductor film 19 can be suppressed. In other words, entry of hydrogen contained in water to the oxide semiconductor film 19 can be suppressed. As a result, a shift of the threshold voltage in the negative direction can be suppressed and variation in electrical characteristics can be reduced.

(Embodiment 4)

In this embodiment, a structure of a transistor and a protective film in which movement of hydrogen and nitrogen to an oxide semiconductor film is suppressed and oxygen vacancies in the oxide semiconductor film can be reduced will be described with reference to FIGS. 6A and 6B. Note that the description about the same structures as those in Embodiment 1 will be omitted.

In a transistor using an oxide semiconductor, oxygen vacancies in an oxide semiconductor film cause defects of electrical characteristics of the transistor. For example, the threshold voltage of a transistor using an oxide semiconductor film with oxygen vacancies easily shifts in the negative direction, and such a transistor tends to be normally-on. This is because electric charges are generated owing to oxygen vacancies in the oxide semiconductor, and the resistance is reduced.

Further, when the oxide semiconductor film includes an oxygen vacancy, as a problem, the amount of change in electrical characteristics, typically, the threshold voltage of the transistor is increased due to a change over time or a bias-temperature stress test (hereinafter also referred to as a BT stress test).

In this embodiment, a transistor with excellent electrical characteristics in which a shift of the threshold voltage in the negative direction is suppressed and a manufacturing method thereof are described. In addition, a highly reliable transistor in which variation in electrical characteristics due to a change over time or a BT photostress test is small and a manufacturing method thereof are described.

Figure 6A:
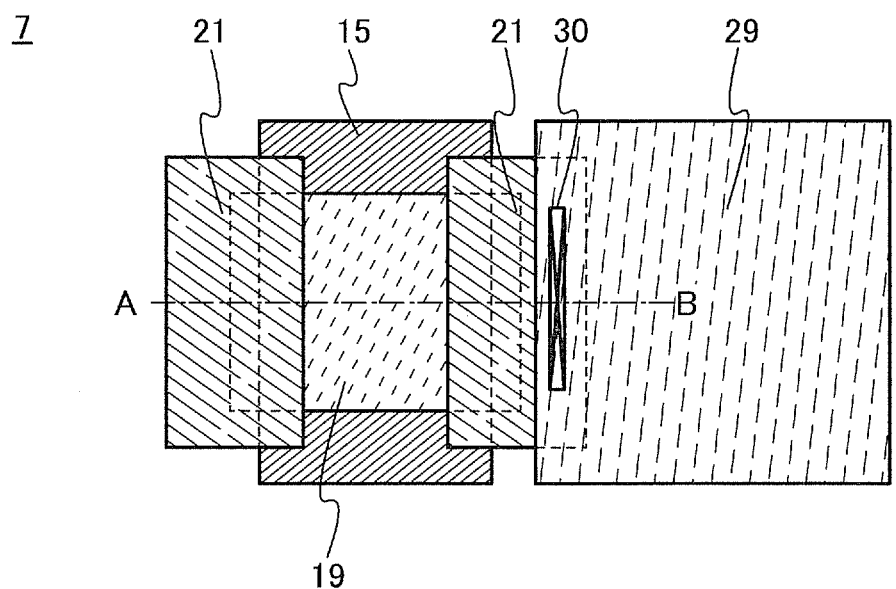
FIGS. 6A and 6B are diagrams illustrating one embodiment of a transistor.
Figure 6B:
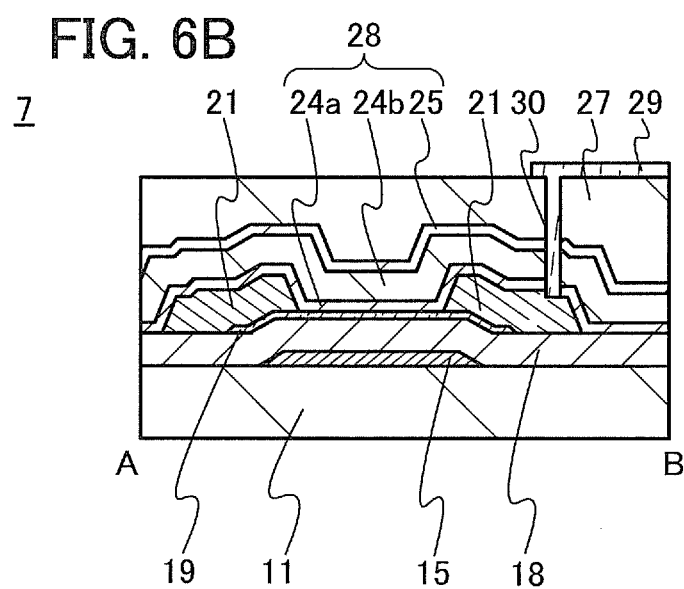

FIGS. 6A and 6B are a top view and a cross-sectional view of a transistor 7 included in a semiconductor device. FIG. 6A is a top view of the transistor 7, and FIG. 6B is a cross-sectional view taken along dashed line A-B in FIG. 6A. Note that in FIG. 6A, the substrate 11, some components of the transistor 7 (e.g., the gate insulating film 18), an insulating film 24a, an insulating film 24b, the nitride insulating film 25, a planarization film 27, and the like are omitted for simplicity.

The transistor 7 illustrated in FIGS. 6A and 6B includes the gate electrode 15 provided over the substrate 11, the gate insulating film 18 formed over the substrate 11 and the gate electrode 15, an oxide semiconductor film 19 overlapping with the gate electrode 15 with the gate insulating film 18 provided therebetween, and a pair of electrodes 21 in contact with the oxide semiconductor film 19. A protective film 28 including the insulating film 24a, the insulating film 24b, and the nitride insulating film 25 is formed over the gate insulating film 18, the oxide semiconductor film 19, and the pair of electrodes 21. In addition, the planarization film 27 may be provided over the protective film 28. Moreover, in an opening 30 formed in the protective film 28 and the planarization film 27, a conductive film 29 connected to one of the pair of electrodes 21 may be provided.

In the transistor 7 shown in this embodiment, the insulating film 24a is formed in contact with the oxide semiconductor film 19. The insulating film 24a is an oxide insulating film which transmits oxygen. Note that the insulating film 24a also functions as a film which relieves damage to the oxide semiconductor film 19 at the time of forming the insulating film 24b later.

As the oxide insulating film which transmits oxygen, a silicon oxide film, a silicon oxynitride film, or the like having a thickness greater than or equal to 5 nm and less than or equal to 150 nm, preferably greater than or equal to 5 nm and less than or equal to 50 nm, more preferably greater than or equal to 10 nm and less than or equal to 30 nm can be used.

Further, it is preferable that the number of defects be small in the insulating film 24a, and typically, the spin density of a signal at g=2.001 which is due to dangling bonds of silicon by ESR measurement be lower than or equal to $3 \times 10^{17}$ spins/cm$^3$, further preferably lower than or equal to $5 \times 10^{16}$ spins/cm$^3$. This is because, when defect density in the insulating film 24a is high, oxygen may be bonded to the defect and the transmittance of oxygen in the insulating film 24a is decreased.

Further, it is preferable that the number of defects be small at an interface between the insulating film 24a and the oxide semiconductor film 19, and typically, the spin density of a signal at g=1.93 which is due to oxygen vacancies in the oxide semiconductor film by ESR measurement in which a magnetic field is applied in parallel to the surface of the film be lower than or equal to $1\times10^{17}$ spins/cm$^3$, further preferably lower than or equal to a lower limit of the detection. The spin density due to oxygen vacancies in the oxide semiconductor film 19 is lower than or equal to the above-described spin density, whereby in Vg-Id characteristics in the transistor including the oxide semiconductor film, variation in the gate voltage at which the transistor is turned on in the case where there is different drain voltages can be reduced.

Note that all oxygen atoms entering the insulating film 24a from the outside are not moved to the outside of the insulating film 24a and some oxygen remains in the insulating film 24a in some cases. Further, oxygen enters the insulating film 24a and oxygen contained in the insulating film 24a is moved to the outside of the insulating film 24a, whereby movement of oxygen in the insulating film 24a occurs in some cases.

By forming the oxide insulating film which transmits oxygen as the insulating film 24a, oxygen released from the oxide insulating film provided over the insulating film 24a, whose oxygen content is in excess of that in the stoichiometric composition, can be moved to the oxide semiconductor film 19 through the insulating film 24a.

The insulating film 24b is formed to be in contact with the insulating film 24a. The insulating film 24b is formed using an oxide insulating film whose oxygen content is in excess of that in the stoichiometric composition. Such an oxide insulating film whose oxygen content is in excess of that in the stoichiometric composition is an oxide insulating film from which part of oxygen is released by heating. The oxide insulating film whose oxygen content is in excess of that in the stoichiometric composition is, similarly to the base insulating film 33 in Embodiment 2, an oxide insulating film in which the amount of released oxygen by conversion into oxygen atoms is greater than or equal to $1\times10^{18}$ atoms/cm$^3$, preferably greater than or equal to $3\times10^{20}$ atoms/cm$^3$ in TDS analysis.

As the insulating film 24a, a silicon oxide film or a silicon oxynitride film can be formed under the following conditions: the substrate placed in a treatment chamber of the plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber.

Note that when the ratio of the amount of the oxidizing gas to the amount of the deposition gas containing silicon is 100 or higher, the hydrogen content in the insulating film 24a can be reduced. Consequently, the amount of hydrogen entering the insulating film 24a can be reduced; thus, the shift of the threshold voltage of the transistor in the negative direction can be suppressed.

As the insulating film 24b, a silicon oxide film, a silicon oxynitride film, or the like having a thickness greater than or equal to 30 nm and less than or equal to 500 nm, preferably greater than or equal to 50 nm and less than or equal to 400 nm can be used.

Further, it is preferable that the insulating film 24b have a few defects, and typically, the spin density of a signal at g=2.001 which is due to dangling bonds of silicon by ESR measurement be lower than or equal to $1\times10^{18}$ spins/cm$^3$. Note that the insulating film 24b is provided more apart from the oxide semiconductor film 19 than the insulating film 24a is; thus, the insulating film 24b may have more defect density than the insulating film 24a.

As the insulating film 24b, a silicon oxide film or a silicon oxynitride film is formed under the following conditions: the substrate placed in a treatment chamber of the plasma CVD apparatus, which is vacuum-evacuated, is held at a temperature higher than or equal to 180° C. and lower than or equal to 260° C., preferably higher than or equal to 180° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions of the insulating film 24b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 24b becomes higher than that in the stoichiometric composition. On the other hand, in the film formed at a substrate temperature within the above temperature range, the bonding strength between silicon and oxygen is weak, and accordingly, part of oxygen in the film is released by heating in the later step. Thus, it is possible to form an oxide insulating film whose oxygen content is in excess of that in the stoichiometric composition and from which part of oxygen is released by heating. Moreover, the insulating film 24a is provided over the oxide semiconductor film 19. In the formation step of the insulating film 24b, the insulating film 24a functions as a film which relieves damage to the oxide semiconductor film 19. Consequently, the insulating film 24b can be formed using the high-frequency power having a high power density while damage to the oxide semiconductor film 19 is reduced.

When the insulating film 24b is formed over the insulating film 24a during heat treatment, oxygen is moved to the oxide semiconductor film 19 and oxygen vacancies in the oxide semiconductor film 19 can be compensated. Alternatively, when the insulating film 24b is formed over the insulating film 24a and is then subjected to heat treatment, oxygen is moved to the oxide semiconductor film 19 and oxygen vacancies in the oxide semiconductor film 19 can be compensated. Consequently, the amount of oxygen vacancies in the oxide semiconductor film can be reduced.

When the oxide insulating film whose oxygen content is in excess of that in the stoichiometric composition is provided over a back channel of the oxide semiconductor film 19 (a surface of the oxide semiconductor film 19, which is opposite to a surface facing the gate electrode 15) with the oxide insulating film which transmits oxygen provided therebetween, oxygen can be moved to the back channel side of the oxide semiconductor film 19, and oxygen vacancies on the back channel side can be reduced.

In the formation step of the insulating film 24b, in the case where the oxide semiconductor film 19 is not damaged, the insulating film 24a is not necessarily provided and only the insulating film 24b which is an oxide insulating film whose oxygen content is in excess of that in the stoichiometric composition may be provided as a protective film.

The nitride insulating film 25 is formed over the insulating film 24b. By providing the nitride insulating film 25, the amount of hydrogen and ammonia which are moved from the nitride insulating film to the oxide semiconductor film 19 is small and the concentration of hydrogen and nitrogen in the oxide semiconductor film 19 can be reduced. Further, the nitride insulating film 25 is provided over the transistor 7, whereby entry of water from the outside to the oxide semiconductor film 19 can be suppressed. In other words, entry of hydrogen contained in water to the oxide semiconductor film 19 can be suppressed. It is preferable that a blocking property of the nitride insulating film 25 against oxygen be high because the movement of oxygen contained in the insulating film 24b to the outside can be suppressed and oxygen contained in the insulating film 24b can be moved to the oxide semiconductor film 19. As a result, a shift of the threshold voltage in the negative direction can be suppressed and variation in electrical characteristics can be reduced. Further, leakage current between a source and a drain of the transistor, typically off-state current, can be reduced. In addition, a change in electrical characteristics due to a change over time or a BT photostress test can be suppressed.

For the planarization film 27, an organic material, such as acrylic resin, epoxy resin, benzocyclobutene resin, polyimide, polyamide, or the like can be used. Other than such organic materials, it is possible to use a silicone resin or the like. Note that the planarization film may be formed by stacking a plurality of insulating films formed using these materials.

The organic material used for the planarization film 27 contains much water or gas than an inorganic insulating film, and the water and the gas are moved to the oxide semiconductor film by heat treatment in some cases. Further, the organic material easily transmits water from the outside. Therefore the planarization film 27 is formed, whereby electrical characteristics in a transistor including the oxide semiconductor film are changed by the water or gas, and the reliability of the transistor may be decreased.

Thus, like the transistor 7 in FIGS. 6A and 6B, the nitride insulating film 25 which has a function of suppressing entry of water is preferably provided between the transistor 7 and the planarization film 27.

Further, the nitride insulating film 25 is preferably provided between the insulating film 24b and the planarization film 27 because the adhesion between the nitride insulating film 25 and the planarization film 27 is improved.

For the conductive film 29, the material used for the pair of electrodes 21 can be used as appropriate. As the conductive film 29, a conductive material having a light-transmitting property can be used, such as indium oxide which includes tungsten oxide, indium zinc oxide which includes tungsten oxide, indium oxide which includes titanium oxide, indium tin oxide which includes titanium oxide, indium tin oxide (hereinafter referred to as ITO), indium zinc oxide, or indium tin oxide which includes silicon oxide.

As the gate insulating film 18, an oxide insulating film whose oxygen content is in excess of that in the stoichiometric composition may be used. An oxide insulating film whose oxygen content is in excess of that in the stoichiometric composition is used as the gate insulating film 18, whereby the interface state between the oxide semiconductor film 19 and the gate insulating film 18 can be reduced, a shift of the threshold voltage in the negative direction can be suppressed, and variation in electrical characteristics of the transistor can be reduced.

After the formation step of the pair of electrodes 21 over the oxide semiconductor film 19 illustrated in FIG. 2C of Embodiment 1, an oxide semiconductor film having few oxygen vacancies may be formed by exposing the oxide semiconductor film 19 to plasma generated in an oxygen atmosphere and supplying oxygen to the oxide semiconductor film 19. Atmospheres of oxygen, ozone, dinitrogen monoxide, nitrogen dioxide, and the like can be given as examples of oxygen atmospheres. Further, in the plasma treatment, the oxide semiconductor film 19 is preferred to be exposed to plasma generated with no bias applied to the substrate 11 side. Consequently, the oxide semiconductor film 19 can be supplied with oxygen without being damaged; accordingly, the amount of oxygen vacancies in the oxide semiconductor film 19 can be reduced. Moreover, impurities remaining on the surface of the oxide semiconductor film 19 due to the etching treatment for forming the pair of electrodes 21, for example, a halogen such as fluorine or chlorine can be removed.

Through the above-described steps, a transistor with the improved reliability, in which a change in electrical characteristics is suppressed, can be manufactured. Further, a transistor in which a change in electrical characteristics due to a change over time or a BT photostress test is small can be manufactured. Typically a transistor with the high reliability, in which variation in threshold voltage is small, can be manufactured.

Note that the structures, methods, and the like described in this embodiment can be used as appropriate in combination with any of the structures, methods, and the like described in the other embodiments and examples.

(Embodiment 5)

In this embodiment, a structure of a gate insulating film which is different from that in Embodiment 2 will be described with reference to FIGS. 7A and 7B.

Figure 7A:
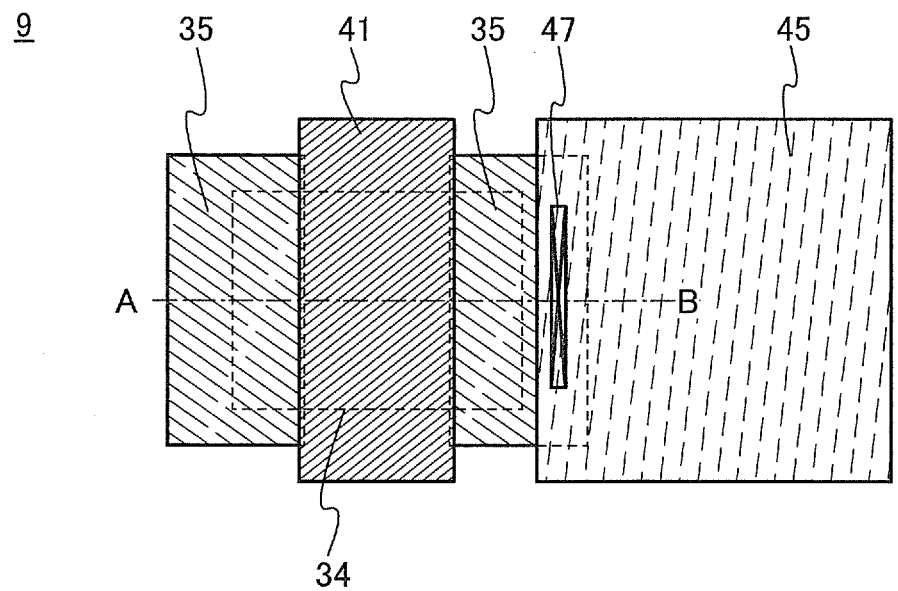
FIGS. 7A and 7B are diagrams illustrating one embodiment of a transistor.
Figure 7B:
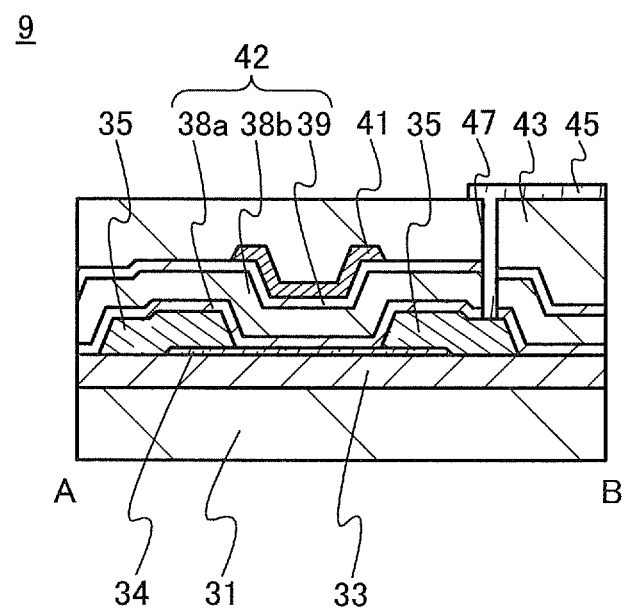

FIGS. 7A and 7B are a top view and a cross-sectional view of a transistor 9 included in a semiconductor device. FIG. 7A is a top view of the transistor 9, and FIG. 7B is a cross-sectional view taken along dashed line A-B in FIG. 7A. Note that in FIG. 7A, the substrate 31, the base insulating film 33, some components of the transistor 9 (e.g., an insulating film 38a, an insulating film 38b, and the nitride insulating film 39), a planarization film 43, and the like are omitted for simplicity.

The transistor 9 illustrated in FIGS. 7A and 7B includes the oxide semiconductor film 34 formed over the base insulating film 33 and the pair of electrodes 35 in contact with the oxide semiconductor film 34. Further, the transistor 9 includes a gate insulating film 42 including the insulating film 38a, the insulating film 38b, and the nitride insulating film 39, and a gate electrode 41 overlapping with the oxide semiconductor film 34 with the gate insulating film 42 provided therebetween. A planarization film 43 covering the gate insulating film 42 and the gate electrode 41 may be included. Moreover, a conductive film 45, which is in contact with one of the pair of electrodes 35 through an opening 47 provided in the gate insulating film 42 and the planarization film 43, may be included.

In the transistor 9 shown in this embodiment, the insulating film 38a is formed in contact with the oxide semiconductor film 34. The insulating film 38a is an oxide insulating film which transmits oxygen. As the insulating film 38a, the insulating film 24a in Embodiment 4 can be used as appropriate.

By forming the oxide insulating film which transmits oxygen as the insulating film 38a, oxygen released from the oxide insulating film provided over the insulating film 38a, whose oxygen content is in excess of that in the stoichiometric composition, can be moved to the oxide semiconductor film 34 through the insulating film 38a.

The insulating film 38b is formed to be in contact with the insulating film 38a. The insulating film 38b is an oxide insulating film whose oxygen content is in excess of that in the stoichiometric composition. As the insulating film 38b, the insulating film 24b in Embodiment 4 can be used as appropriate.

When the insulating film 38b is formed over the insulating film 38a during heat treatment, oxygen is moved to the oxide semiconductor film 34 and oxygen vacancies in the oxide semiconductor film 34 can be compensated. Alternatively, when the insulating film 38b is formed over the insulating film 38a and is then subjected to heat treatment, oxygen is moved to the oxide semiconductor film 34 and oxygen vacancies in the oxide semiconductor film 34 can be compensated. Consequently, the amount of oxygen vacancies in the oxide semiconductor film can be reduced.

As the gate insulating film, an insulating film having few defects is used, whereby a shift of the threshold voltage in the negative direction can be suppressed and variation in electrical characteristics of the transistor can be reduced.

In the formation step of the insulating film 38b, in the case where the oxide semiconductor film 34 is not damaged, the insulating film 38a is not necessarily provided and only the insulating film 38b which is an oxide insulating film from which part of oxygen is released by heating may be provided.

The nitride insulating film 39 is formed over the insulating film 38b. By providing the nitride insulating film 39, the amount of hydrogen and ammonia which are moved from the nitride insulating film to the oxide semiconductor film 34 is small and the concentration of hydrogen and nitrogen in the oxide semiconductor film 34 can be reduced. Further, the nitride insulating film 39 is provided over the transistor 9, whereby entry of water from the outside to the oxide semiconductor film 34 can be suppressed. In other words, entry of hydrogen contained in water to the oxide semiconductor film 34 can be suppressed. It is preferable that a blocking property of the nitride insulating film 39 against oxygen be high because the movement of oxygen contained in the insulating film 38b to the outside can be suppressed and oxygen contained in the insulating film 38b can be moved to the oxide semiconductor film 34. As a result, a shift of the threshold voltage in the negative direction can be suppressed and variation in electrical characteristics can be reduced. Further, leakage current between a source and a drain of the transistor, typically off-state current, can be reduced. In addition, a change in electrical characteristics due to a change over time or a BT photostress test can be suppressed.

The planarization film 43 can be formed using the material of the planarization film 27, which is described in Embodiment 4, as appropriate.

Note that the nitride insulating film 39 is preferably provided between the insulating film 38b and the planarization film 43 because the adhesion between the nitride insulating film 39 and the planarization film 43 is improved.

For the conductive film 45, the material of the conductive film 29, which is described in Embodiment 4, can be used as appropriate.

As in Embodiment 4, in this embodiment, after the formation step of the pair of electrodes 35 over the oxide semiconductor film 34 illustrated in FIG. 4B of Embodiment 2, an oxide semiconductor film having few oxygen vacancies may be formed by exposing the oxide semiconductor film 34 to plasma generated in an oxygen atmosphere and supplying oxygen to the oxide semiconductor film 34. Consequently, the oxide semiconductor film 34 can be supplied with oxygen without being damaged; accordingly, the amount of oxygen vacancies in the oxide semiconductor film 34 can be reduced.

Through the above-described steps, a transistor with the improved reliability, in which a change in electrical characteristics is suppressed, can be manufactured. Further, a transistor in which a change in electrical characteristics due to a change over time or a BT photostress test is small can be manufactured. Typically a transistor with the high reliability, in which variation in threshold voltage is small, can be manufactured.

Note that the structures, methods, and the like described in this embodiment can be used as appropriate in combination with any of the structures, methods, and the like described in the other embodiments and examples.

(Embodiment 6)

Figure 9A:
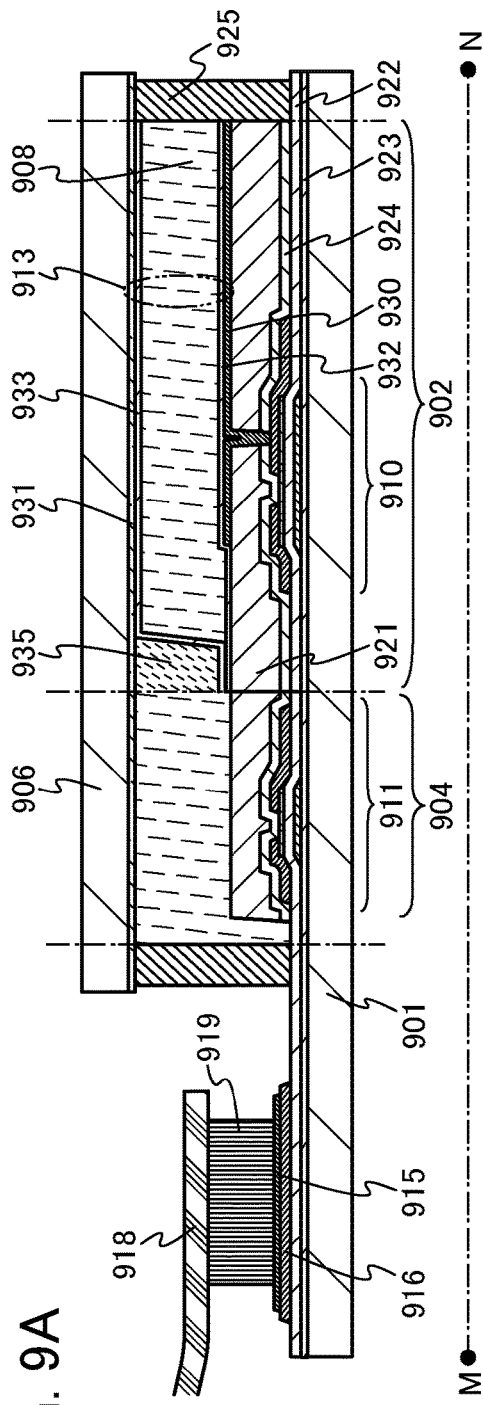
FIGS. 9A and 9B are cross-sectional views illustrating one embodiment of a display device.
Figure 9B:
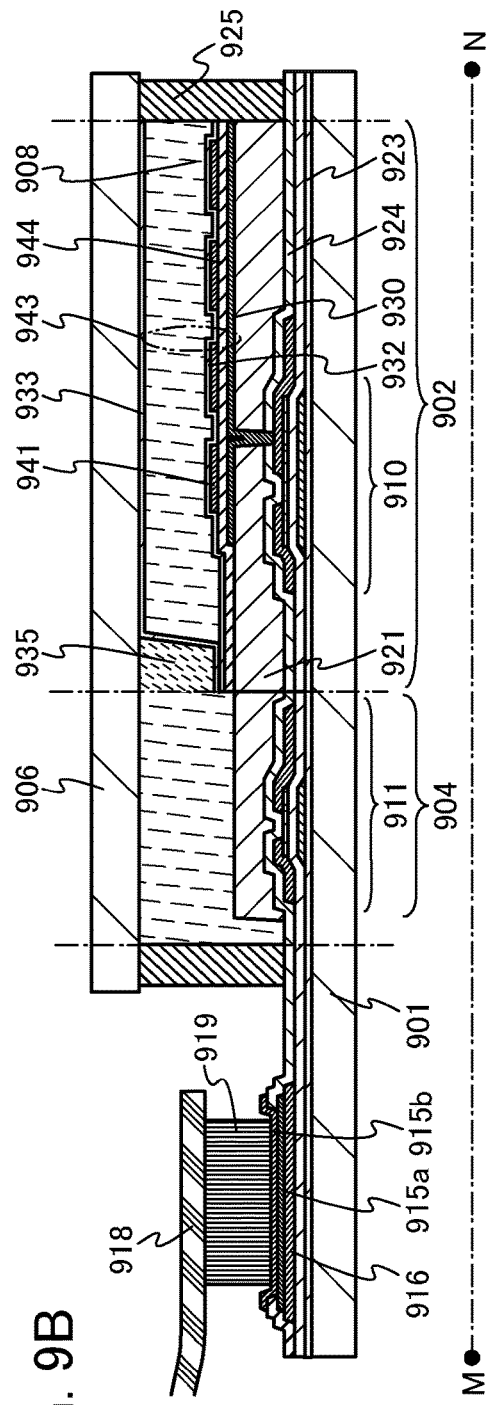
Figure 10:
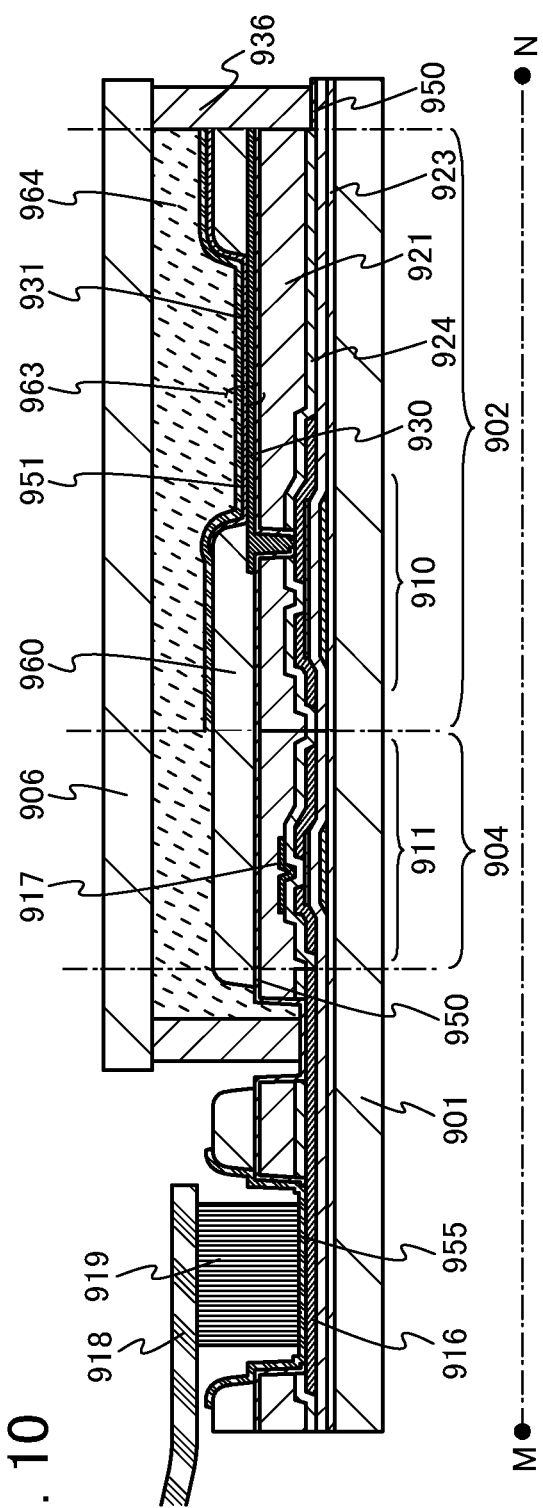
FIG. 10 is a cross-sectional view illustrating one embodiment of a display device.

A semiconductor device (also referred to as a display device) having a display function can be manufactured using the transistor examples of which are shown in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 8A to 8C, FIGS. 9A and 9B, FIG. 10, and FIGS. 11A to 11C. FIGS. 9A, 9B, and FIG. 10 are cross-sectional views illustrating cross-sectional structures taken along chain line M-N in FIG. 8B.

Figure 8A:
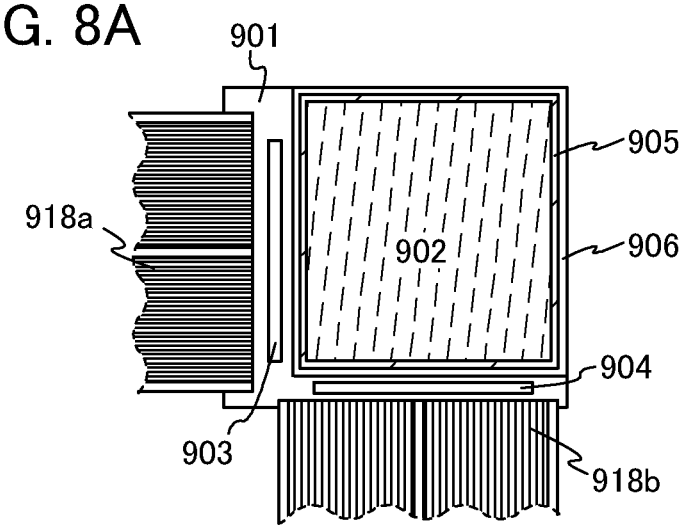
FIGS. 8A to 8C are top views illustrating one embodiment of a display device.

In FIG. 8A, a sealant 905 is provided so as to surround a pixel portion 902 provided over a first substrate 901, and the pixel portion 902 is sealed with a second substrate 906. In FIG. 8A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 8B:
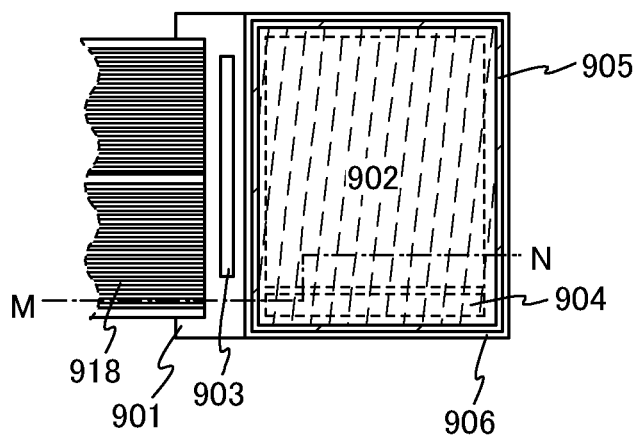
Figure 8C:
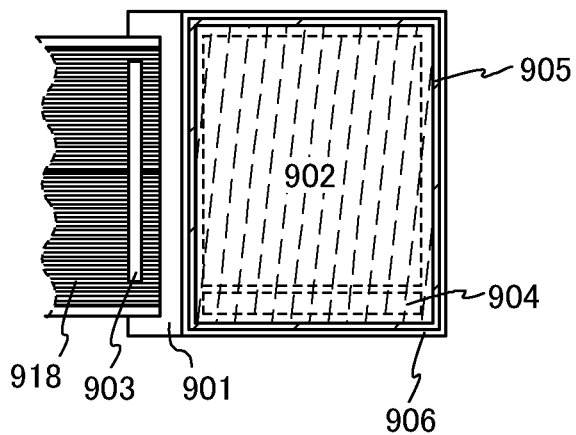

In FIGS. 8B and 8C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 8B and 8C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 8B and 8C, various signals and potentials are supplied to the signal line driver circuit 903, the scan line driver circuit 904, and the pixel portion 902 from an FPC 918.

Although FIGS. 8B and 8C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 8A shows an example in which the signal line driver circuit 903 and the scan line driver circuit 904 are mounted by a COG method. FIG. 8B shows an example in which the signal line driver circuit 903 is mounted by a COG method. FIG. 8C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

A light-emitting device shown in FIG. 9A includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

A light-emitting device shown in FIG. 9B includes a connection terminal electrodes 915a, 915b, and a terminal electrode 916. The connection terminal electrodes 915a, 915b, and the terminal electrode 916 are electrically connected to a terminal included in the FPC 918 through an anisotropic conductive agent 919.

The connection terminal electrode 915a is formed using the same conductive film as a first electrode 930, the connection terminal electrode 915b is formed using the same conductive film as a second electrode 941, and the terminal electrode 916 is formed using the same conductive film as a pair of electrodes in each of a transistor 910 and a transistor 911.

Further, as illustrated in FIG. 10, the semiconductor device includes a connection terminal electrode 955 and a terminal electrode 916. The connection terminal electrode 955 and the terminal electrode 916 are electrically connected to a terminal included in the FPC 918 through an anisotropic conductive agent 919.

The connection terminal electrode 955 is formed using the same conductive film as a second electrode 951, and the terminal electrode 916 is formed using the same conductive film as a pair of electrodes in each of a transistor 910 and a transistor 911.

Each of the pixel portion 902 and the scan line driver circuit 904 which are provided over the first substrate 901 includes a plurality of transistors. FIGS. 9A, 9B, and FIG. 10 illustrate the transistor 910 included in the pixel portion 902 and the transistor 911 included in the scan line driver circuit 904. In FIG. 9A, the protective film 26 described in Embodiment 1 or an insulating film 924 corresponding to the protective film 28 in Embodiment 4 is provided over the transistor 910 and the transistor 911. In FIG. 9B, a planarization film 921 is further provided over the insulating film 924. Note that an insulating film 923 serves as a base film.

In this embodiment, any of the transistors described in the above embodiments can be used as the transistor 910 and the transistor 911.

Moreover, FIG. 10 shows an example in which a conductive film 917 is provided over the insulating film 924 so as to overlap with a channel formation region of the oxide semiconductor film of the transistor 911 for the driver circuit. In this embodiment, the conductive film 917 is formed using the same conductive film as the first electrode 930. By providing the conductive film 917 so as to overlap with the channel formation region of the oxide semiconductor film, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V or in a floating state.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent a change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930, the second electrode 931, and the second electrode 941 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, the first electrode 930, the second electrode 931, and the second electrode 941 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930, the second electrode 931, and the second electrode 941 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

An example of a liquid crystal display device using a liquid crystal element as a display element is illustrated in FIGS. 9A and 9B. FIG. 9A illustrates an example in which a vertical electric field method is employed.

In FIG. 9A, a liquid crystal element 913 which is a display element includes the first electrode 930, a second electrode 931, and a liquid crystal layer 908. Note that an insulating film 932 and an insulating film 933 which serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

FIG. 9B illustrates an example in which a fringe field switching (FFS) mode, which is one of horizontal electric field modes, is employed.

In FIG. 9B, a liquid crystal element 943 which is a display element includes the first electrode 930, the second electrode 941, and the liquid crystal layer 908 which are formed over the planarization film 921. The second electrode 941 functions as the common electrode. An insulating film 944 is provided between the first electrode 930 and the second electrode 941. The insulating film 944 is formed using a silicon nitride film. An insulating film 932 and an insulating film 933 which serve as alignment films are provided so that the liquid crystal layer 908 is interposed therebetween.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by the sealant 925. As the sealant 925, an organic resin such as a thermosetting resin or a photocurable resin can be used.

In the liquid crystal display device in FIG. 9A, the sealant 925 is in contact with a gate insulating film 922, and the planarization film 921 is provided on an inner side than the sealant 925. Note that the gate insulating film 922 is formed by stacking a silicon nitride film and a silicon oxynitride film. Further, when the insulating film 924 is selectively etched, it is preferable that the silicon nitride film be exposed by etching the silicon oxynitride film in the upper layer of the gate insulating film 922. As a result, the sealant 925 is in contact with the silicon nitride film formed in the gate insulating film 922, and entry of water from the outside into the sealant 925 can be suppressed.

In the liquid crystal display device in FIG. 9B, the sealant 925 is in contact with the insulating film 924. The planarization film 921 is provided on an inner side than the sealant 925 and the sealant 925 is in contact with the silicon nitride film on the surface of the insulating film 924; thus, entry of water from the outside into the sealant 925 can be suppressed.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is ⅓ or less, preferably ⅕ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Figure 11A:
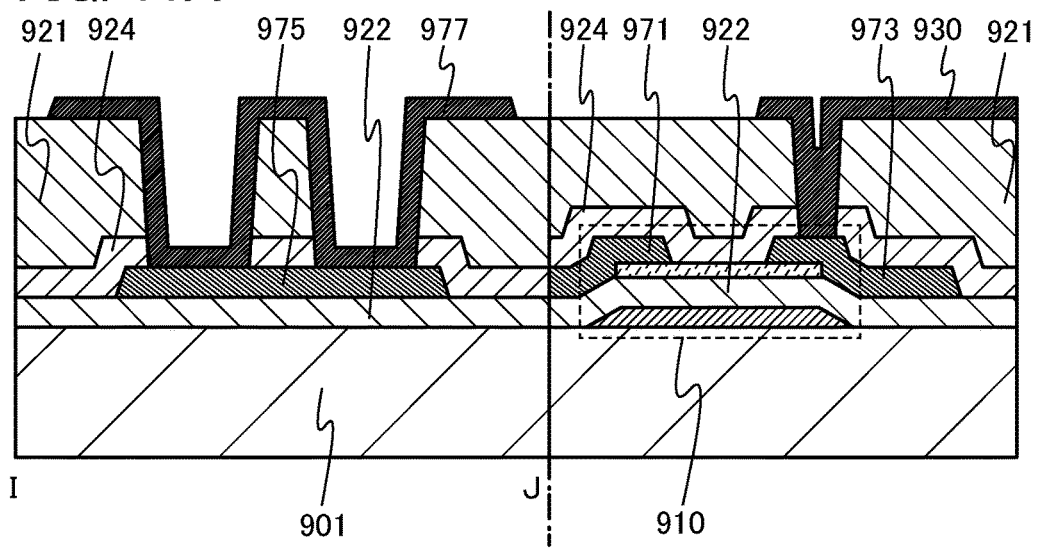
FIGS. 11A to 11C are cross-sectional views and a top view illustrating one embodiment of a display device.
Figure 11B:
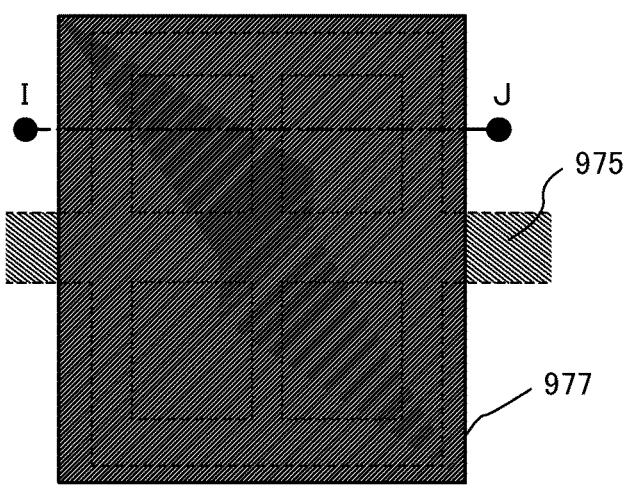
Figure 11C:
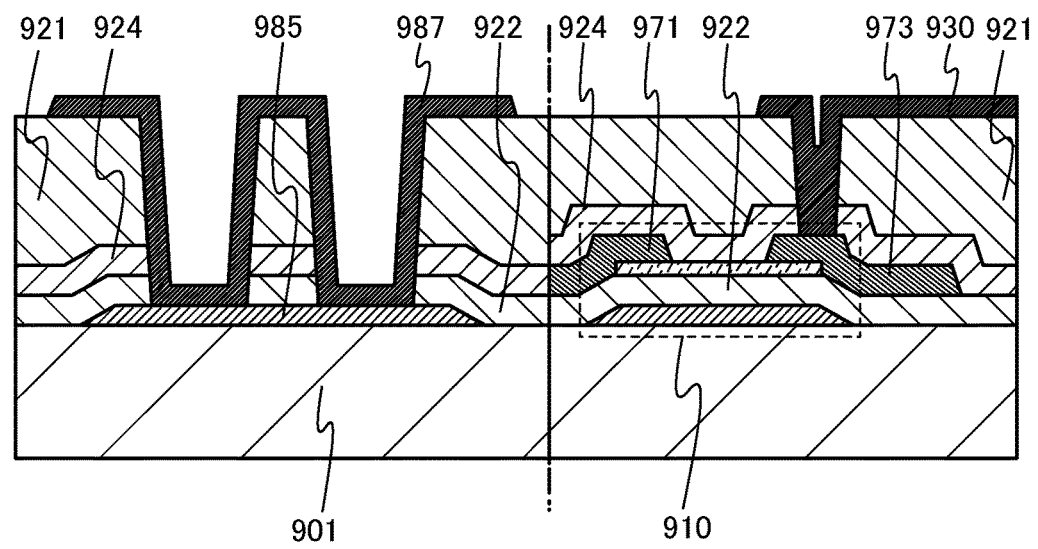

FIGS. 11A to 11C illustrate an example of the display device in FIG. 9A in which a common connection portion (pad portion) for electrically connecting to the second electrode 931 provided on the second substrate 906 is formed over the first substrate 901.

Note that the contact hole in the pixel portion and the openings in the common connection portion are distinctively described because their sizes differ considerably. In FIGS. 9A and 9B and FIGS. 11A to 11C, the pixel portion 902 and the common connection portion are not illustrated on the same scale. For example, the length of the chain line I-J in the common connection portion is about 500 μm, whereas the size of the transistor of the pixel portion 902 is less than 50 μm; thus, the area of the common connection portion is ten times or more as large as that of the transistor. However, the scales of the pixel portion 902 and the common connection portion are changed in FIGS. 9A and 9B and FIGS. 11A to 11C for simplification.

The common connection portion is provided in a position that overlaps with the sealant for bonding the first substrate 901 and the second substrate 906, and is electrically connected to the second electrode 931 through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the second electrode 931.

FIG. 11A is a cross-sectional view of the common connection portion taken along a line I-J in the top view in FIG. 11B.

A common potential line 975 is provided over the gate insulating film 922 and is formed using the same material and through the same steps as the source electrode 971 or the drain electrode 973 of the transistor 910 illustrated in FIGS. 9A and 9B.

Further, the common potential line 975 is covered with the insulating film 924 and the planarization film 921, and a plurality of openings is included in the insulating film 924 and the planarization film 921 at a position overlapping with the common potential line 975. These openings are formed through the same steps as a contact hole which connects the first electrode 930 and one of the source electrode 971 and the drain electrode 973 of the transistor 910.

Further, the common potential line 975 is connected to the common electrode 977 through the opening. The common electrode 977 is provided over the planarization film 921 and formed using the same material and through the same steps as the connection terminal electrode 915 and the first electrode 930 in the pixel portion.

In this manner, the common connection portion can be manufactured in the same process as the switching element in the pixel portion 902.

The common electrode 977 is an electrode in contact with the conductive particles contained in the sealant, and is electrically connected to the second electrode 931 of the second substrate 906.

Alternatively, as illustrated in FIG. 11C, a common potential line 985 may be formed using the same material and through the same steps as the gate electrode of the transistor 910.

In the common connection portion in FIG. 11C, the common potential line 985 is provided under the gate insulating film 922, the insulating film 924, and the planarization film 921, and a plurality of openings is included in the gate insulating film 922, the insulating film 924, and the planarization film 921 at a position overlapping with the common potential line 985. These openings are formed by etching the insulating film 924 and the planarization film 921 and further selectively etching the gate insulating film 922, which are the same steps as a contact hole which connects the first electrode 930 and one of the source electrode 971 and the drain electrode 973 of the transistor 910.

Further, the common potential line 985 is connected to the common electrode 987 in the opening portion. The common electrode 987 is provided over the planarization film 921 and formed using the same material and through the same steps as the connection terminal electrode 915 and the first electrode 930 in the pixel portion.

Note that in the liquid crystal display device of an FFS mode in FIG. 9B, the common electrodes 977 and 987 are each connected to the second electrode 941.

Next, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as the display element is shown in FIG. 10. A light-emitting element 963 which is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A silicon nitride film 950 is provided between the planarization film 921 and the first electrode 930. The silicon nitride film 950 is in contact with side surfaces of the planarization film 921 and the insulating film 924. A partition wall 960 is provided over end portions of the silicon nitride film 950 and the first electrode 930. A partition wall 960 can be formed using an organic insulating material or an inorganic insulating material. It is particularly preferred that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the first substrate 901, the second substrate 906, and a sealant 936, a filler 964 is provided and sealed. It is preferred that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fitted glass including low-melting glass, or the like can be used. The fritted glass is preferred because of its high barrier property against impurities such as water and oxygen. Further, in the case where the fritted glass is used as the sealant 936, as illustrated in FIG. 10, the fitted glass is provided over the silicon nitride film 950, whereby adhesion of the silicon nitride film 950 to the fritted glass becomes high and entry of water from the outside into the sealant 936 can be prevented.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

Since the transistor is easily broken owing to static electricity or the like, a protective circuit for protecting the driver circuit is preferred to be provided. The protection circuit is preferred to be formed using a nonlinear element.

As described above, by using any of the transistors described in the above embodiments, a highly reliable semiconductor device having a display function can be provided.

This embodiment can be implemented in appropriate combination with the structures described in the other embodiments.

(Embodiment 7)

A semiconductor device having an image sensor function for reading data of an object can be formed with the use of the transistor described in any of Embodiments 1 to 6.

Figures 12A, 12B:
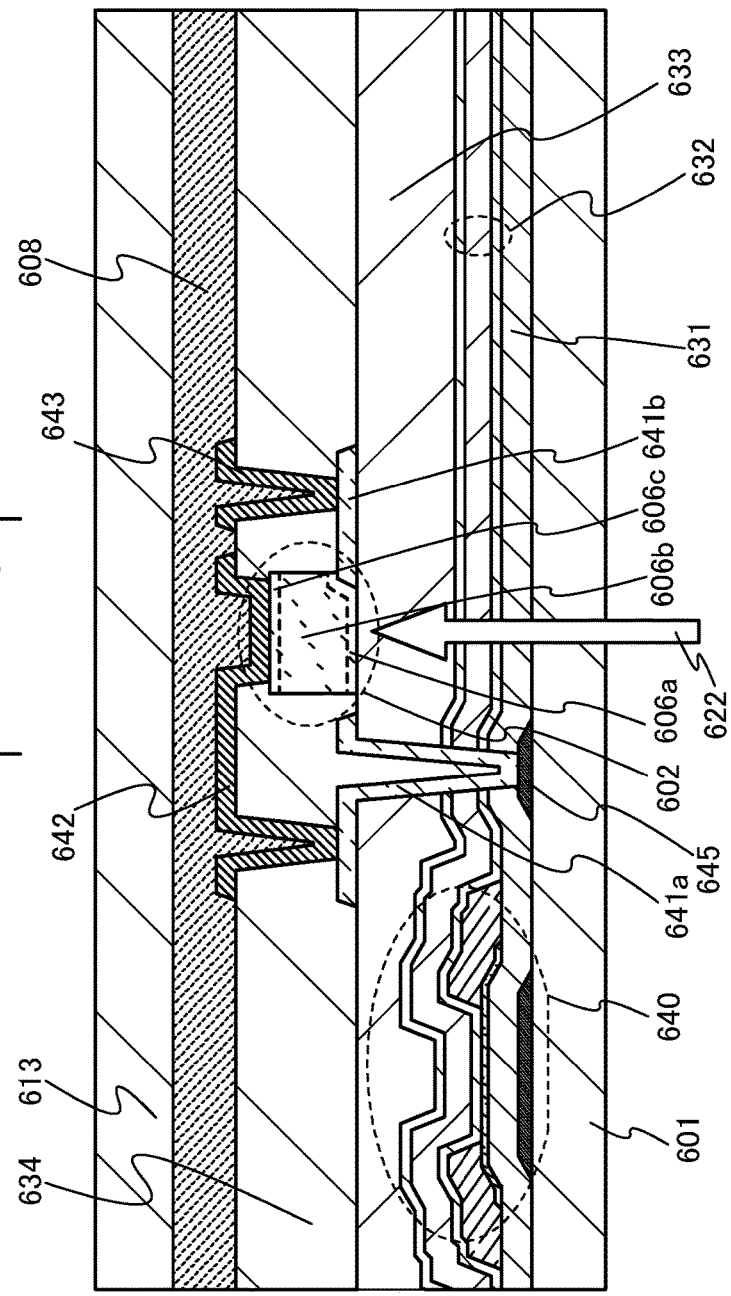
FIGS. 12A and 12B illustrate one embodiment of a semiconductor device.

An example of a semiconductor device having an image sensor function is illustrated in FIG. 12A. FIG. 12A illustrates an equivalent circuit of a photo sensor, and FIG. 12B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. In FIG. 12A, the transistor 640 and the transistor 656 are each a transistor including an oxide semiconductor film, to which the transistor described in any of Embodiments 1 to 6 can be applied. In this embodiment, an example in which a transistor having a structure similar to that of the transistor 7 described in Embodiment 4 is applied is described.

FIG. 12B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 interposed therebetween.

An insulating film 632, a planarization film 633, and a planarization film 634 are provided over the transistor 640. The photodiode 602 includes an electrode 641b formed over the planarization film 633; a first semiconductor film 606a, a second semiconductor film 606b, and a third semiconductor film 606c over the electrode 641b in this order; an electrode 642 which is provided over the planarization film 634 and electrically connected to the electrode 641b through the first to third semiconductor films; and an electrode 641a which is provided in the same layer as the electrode 641b and electrically connected to the electrode 642.

The electrode 641b is electrically connected to a conductive layer 643 formed over the planarization film 634, and the electrode 642 is electrically connected to a conductive film 645 through the electrode 641a. The conductive film 645 is electrically connected to a gate electrode of the transistor 640, and thus the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor film 606a is preferably formed to a thickness greater than or equal to 10 nm and less than or equal to 50 nm The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by the photoelectric effect is lower than the mobility of electrons. Therefore, a PIN photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Light from the semiconductor film having a conductivity type opposite to that of the semiconductor film on the light-receiving plane is disturbance light; therefore, the electrode is preferably formed using a light-blocking conductive film. Note that the n-type semiconductor film side may alternatively be a light-receiving plane.

The insulating film 632, the planarization film 633, and the planarization film 634 can be formed using an insulating material by a sputtering method, a plasma CVD method, spin coating, dipping, spray coating, a droplet discharge method (such as an inkjet method), screen printing, offset printing, or the like depending on the material.

For the planarization films 633 and 634, for example, an organic insulating material having heat resistance, such as polyimide, acrylic resin, a benzocyclobutene-based resin, polyamide, or epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object to be detected can be read. Note that a light source such as a backlight can be used at the time of reading information on an object.

The structure, method, and the like described in this embodiment can be used in combination with structures, methods, and the like described in other embodiments and examples, as appropriate.

(Embodiment 8)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 13A to 13C.

Figure 13A:
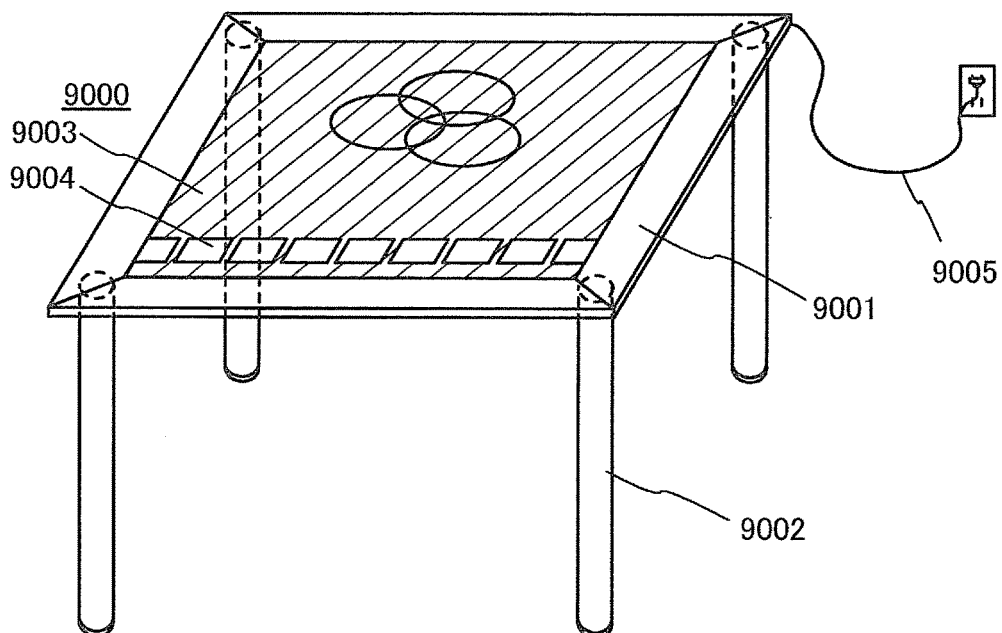
FIGS. 13A to 13C each illustrate an electronic device.
Figure 13B:
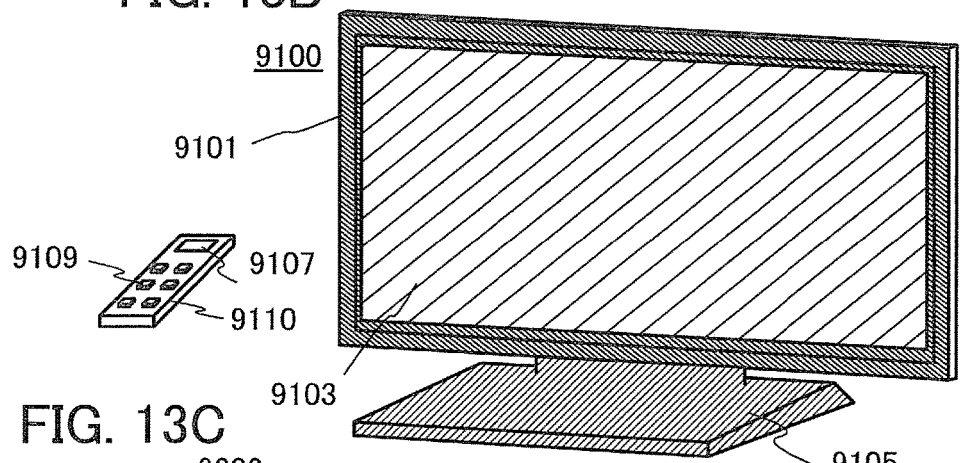
Figure 13C:
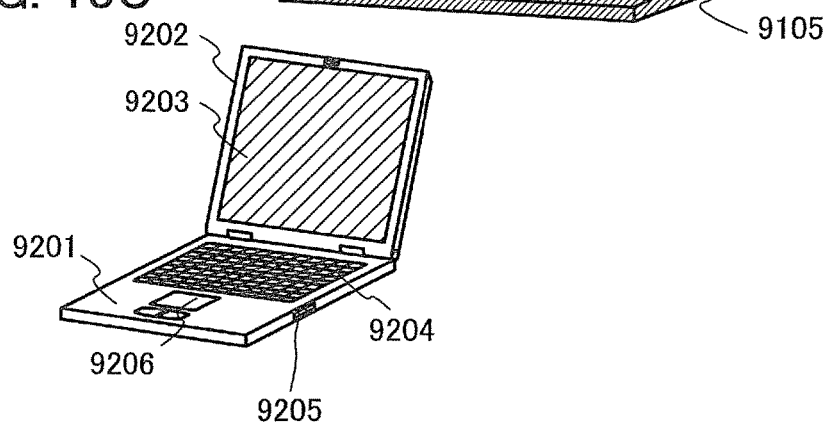

FIG. 13A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 7, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 13B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 13B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television set and the remote controller can have high reliability.

FIG. 13C illustrates a computer, which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

Figure 14A:
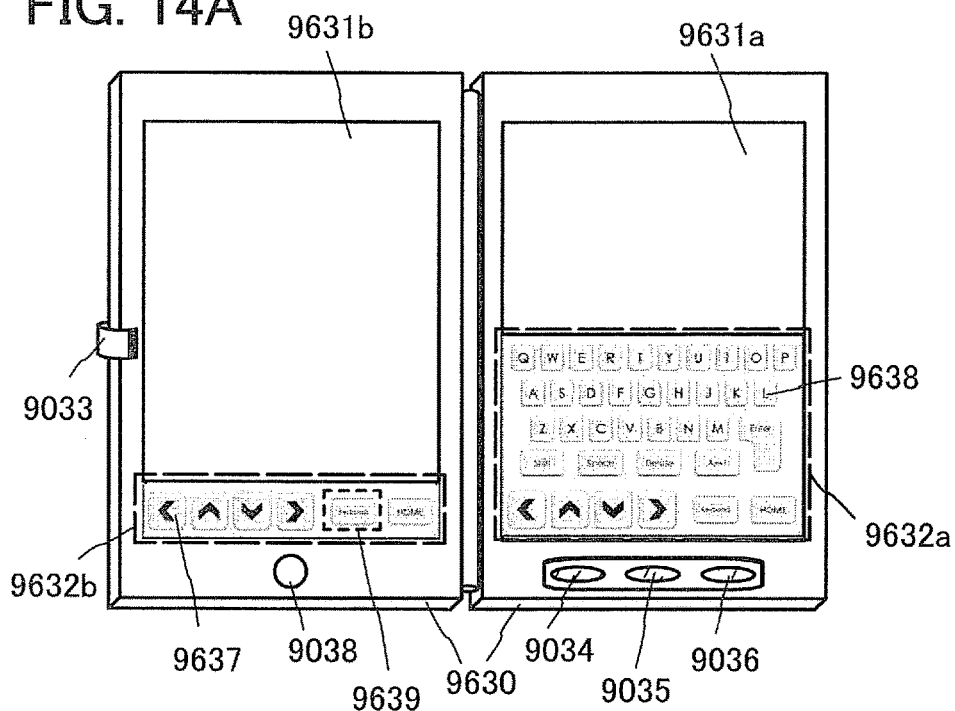
FIGS. 14A to 14C illustrate an electronic device.
Figure 14B:
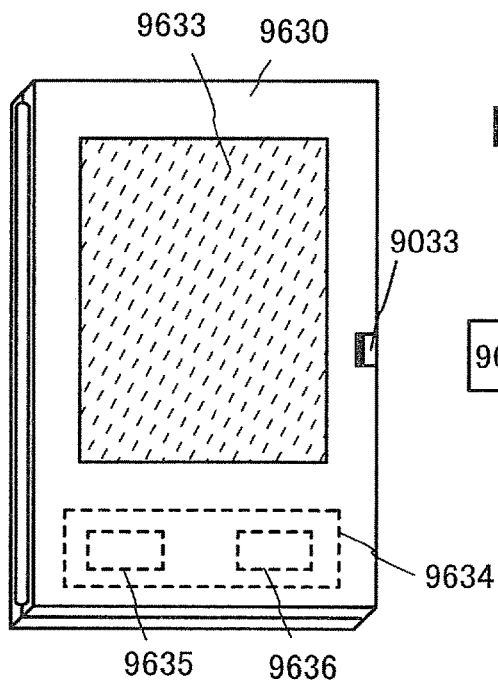

FIGS. 14A and 14B illustrate a tablet terminal that can be folded. In FIG. 14A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b, so that the tablet terminal can have high reliability.

Part of the display portion 9631a can be a touch panel region 9632a, and data can be input by touching operation keys 9638 that are displayed. Although a structure in which a half region in the display portion 9631a has only a display function and the other half region also has a touch panel function is shown as an example, the display portion 9631a is not limited to the structure. However, the structure of the display portion 9631a is not limited to this, and all the area of the display portion 9631a may have a touch panel function. For example, all the area of the display portion 9631a can display keyboard buttons and serve as a touch panel while the display portion 9631a can be used as a display screen.

In the display portion 9631a, as in the display portion 9631a, part of the display portion 9631a can be a touch panel region 9632b. When a finger, a stylus, or the like touches the place where a button 9639 for switching to keyboard display is displayed in the touch panel, keyboard buttons can be displayed on the display portion 9631a.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036 for switching to power-saving mode, the luminance of display can be optimized in accordance with the amount of external light at the time when the tablet is in use, which is detected with an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 14A, one embodiment of the present invention is not limited to this example. The display portion 9631a and the display portion 9631a may have different areas or different display quality. For example, one of them may be a display panel that can display higher-definition images than the other.

FIG. 14B illustrates the tablet terminal folded, which includes the housing 9630, a solar battery 9633, and a charge and discharge control circuit 9634. Note that FIG. 14B shows an example in which the charge and discharge control circuit 9634 includes a battery 9635 and a DCDC converter 9636.

Since the tablet terminal can be folded in two, the housing 9630 can be closed when the tablet terminal is not in use. Thus, the display portions 9631a and 9631a can be protected, thereby providing a tablet terminal with high endurance and high reliability for long-term use.

The tablet terminal illustrated in FIGS. 14A and 14B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or two surfaces of the housing 9630, so that the battery 9635 can be charged efficiently. When a lithium ion battery is used as the battery 9635, there is an advantage of downsizing or the like.

Figure 14C:
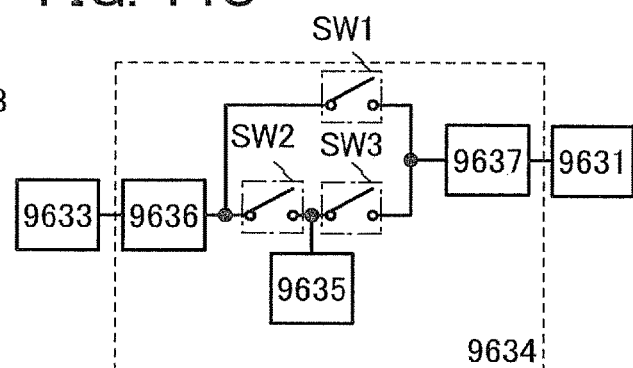

The structure and operation of the charge and discharge control circuit 9634 illustrated in FIG. 14B are described with reference to a block diagram of FIG. 14C. The solar battery 9633, the battery 9635, the DCDC converter 9636, a converter 9637, switches SW1 to SW3, and the display portion 9631 are illustrated in FIG. 14C, and the battery 9635, the DCDC converter 9636, the converter 9637, and the switches SW1 to SW3 correspond to the charge and discharge control circuit 9634 illustrated in FIG. 14B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structure, method, and the like described in this embodiment can be used in combination with structures, methods, and the like described in other embodiments, as appropriate.

EXAMPLE 1

In this example, results of evaluating a nitride insulating film which can be used for the transistor of one embodiment of the present invention are described. In detail, results of evaluating the number of hydrogen molecules, ammonia molecules, and water molecules which are released by heating are described.

First, a method for forming the evaluated samples is described. The formed samples each have a structure 1 or a structure 2.

Figure 15A:
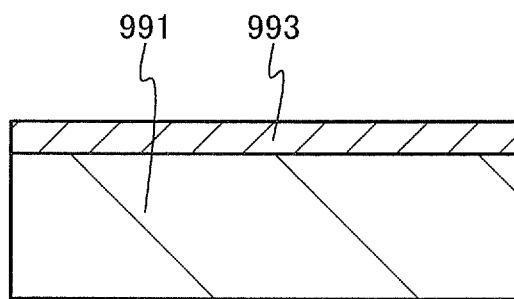
FIGS. 15A and 15B each illustrate a structure of a sample.

A silicon nitride film 993 was formed over a silicon wafer 991 by a plasma CVD method using formation conditions which can be used for the nitride insulating film 25 described in Embodiment 1 (see FIG. 1B), so that the sample having the structure 1 was formed (see FIG. 15A).

The silicon nitride film 993 was formed using three conditions which are a condition 1, a condition 2, and a condition 3. The sample formed using the condition 1 is referred to as a sample A1. The sample formed using the condition 2 is referred to as a sample A2. The sample formed using condition 3 is referred to as a sample A3. The samples A1 to A3 each have the silicon nitride film 993 with a thickness of 50 nm The condition 1 was as follows: the temperature of the silicon wafer 991 was 220° C.; the source gas was silane, nitrogen, and ammonia with a flow rate of 50 sccm, 5000 sccm, and 100 sccm, respectively; the pressure of the treatment chamber was 200 Pa; and the high-frequency power supplied to parallel plate electrodes was 27.12 MHz and 1000 W (the power density was $1.6 \times 10^{-1}$ W/cm$^2$). The flow ratio of nitrogen to ammonia was 50.

The condition 2 was the same as the condition 1 except that the high-frequency power supplied to parallel plate electrodes was 150 W (the power density was $2.5 \times 10^{-2}$ W/cm$^2$).

The condition 3 was as follows: the temperature of the silicon wafer 991 was 220° C.; the source gas was silane, nitrogen, and ammonia with a flow rate of 30 sccm, 1500 sccm, and 1500 sccm, respectively; the pressure of the treatment chamber was 200 Pa; and the high-frequency power supplied to parallel plate electrodes was 27.12 MHz and 150 W (the power density was $2.5 \times 10^{-2}$ W/cm$^2$). The flow ratio of nitrogen to ammonia was 1.

TDS analyses were performed on the samples A1 to A3. In each of the samples, the silicon wafer 991 was heated at 65° C. or higher and 610° C. or lower.

The peaks of the curves shown in the results obtained from TDS appear due to release of atoms or molecules contained in the analyzed samples (in this example, the samples A1 to A3) to the outside. The total number of the atoms or molecules released to the outside corresponds to the integral value of the peak. Thus, with the degree of the peak intensity, the number of the atoms or molecules contained in the silicon nitride film can be evaluated.

FIGS. 16A to 16C and FIGS. 17A and 17B show the results of the TDS analyses on the samples A1 to A3. FIG. 16A is a graph of the amount of a released gas which has a M/z of 2, typically hydrogen molecules, against the substrate temperature. FIG. 16B is a graph of the amount of a released gas which has a M/z of 18, typically water molecules, against the substrate temperature. FIG. 16C is a graph of an amount of released hydrogen molecules calculated from an integral value of a peak of a curve in FIG. 16A. FIG. 17A is a graph of the amount of a released gas which has a M/z of 17, typically ammonia molecules, against the substrate temperature. FIG. 17B is a graph of an amount of released ammonia molecules calculated from an integral value of a peak of a curve in FIG. 17A. In these TDS analyses, the lower limit of detection of hydrogen molecules was $1 \times 10^{21}$ molecules/cm$^3$, and, the lower limit of detection of ammonia molecules was $2 \times 10^{20}$ molecules/cm$^3$.

As shown in FIG. 16A, the TDS intensity of hydrogen molecules of the sample A2 is higher than that of the sample A1 and that of the sample A3. As shown in FIG. 16C, the amount of released hydrogen molecules of the sample A2 against the substrate temperature is approximately five times that of the sample A1 and the sample A3. As shown in FIG. 16B, in the samples A1 to A3, a peak indicating the release of water molecules is seen when the temperature of each substrate was in the range from higher than or equal to 100° C. to lower than or equal to 200° C. Note that only in the sample A3, a sharp peak was detected in the range.

In contrast, as shown in FIG. 17A, the TDS intensity of ammonia molecules of the sample A3 is higher than that of the sample A1 and the sample A2. As shown in FIG. 17B, the amount of released ammonia molecules of the sample A3 against the substrate temperature is at least approximately greater than or equal to 16 times that of the sample A1 and the sample A2. The amount of released ammonia molecules of the sample A2 is less than or equal to the lower limit of detection.

Figure 15B:
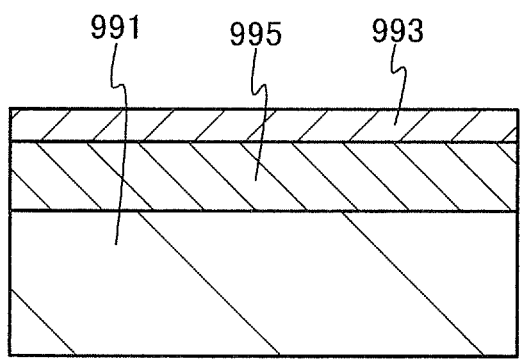

Next, the structure 2 which was employed to some of the formed samples is described. A silicon oxynitride film 995 was formed over the silicon wafer 991 by a plasma CVD method using formation conditions which can be used for the insulating film 24b described in Embodiment 4 (see FIG. 6B), and the silicon nitride film 993 was formed over the silicon oxynitride film 995 in a manner similar to the structure 1, so that the sample having the structure 2 was formed (see FIG. 15B).

In each of the samples having the structure 2, in order to evaluate an effect of suppressing movement of water in the silicon nitride film 993, the silicon oxynitride film 995 is a silicon oxynitride film whose oxygen content is in excess of that in the stoichiometric composition. FIGS. 19A and 19B show the results of TDS analyses on samples in each of which only the silicon oxynitride film 995 having a thickness of 400 nm was formed over a silicon wafer. In each of the samples, the silicon wafer 991 was heated at 70° C. or higher and 570° C. or lower. FIG. 19A is a graph of the amount of a released gas which has a M/z of 32, typically oxygen molecules, against the substrate temperature. FIG. 19B is a graph of the amount of a released gas which has a M/z of 18, typically water molecules, against the substrate temperature. The silicon oxynitride film whose oxygen content is in excess of that in the stoichiometric composition contains not only oxygen (see FIG. 19A) but also water (see FIG. 19B); thus, by evaluating an amount of released water molecules against the substrate temperature of the samples A4 to A6 having the structure 2, whether or not the silicon nitride film 993 has an effect of suppressing movement of water can be evaluated.

The formation conditions of the silicon oxynitride film 995 was as follows: the temperature of the silicon wafer 991 was 220° C.; the source gas was silane and nitrogen monoxide with a flow rate of 160 sccm and 4000 sccm, respectively; the pressure of the treatment chamber was 200 Pa; and the high-frequency power supplied to parallel plate electrodes was 27.12 MHz and 1500 W (the power density was $2.5 \times 10^{-1}$ W/cm$^2$). The thickness of the silicon oxynitride film 995 was 400 nm.

In the samples having the structure 2, the silicon nitride film 993 was formed using the three conditions, which are the condition 1, the condition 2, and the condition 3. The sample which has the structure 2 and is formed using the condition 1 is referred to as a sample A4. The sample which has the structure 2 and is formed using the condition 2 is referred to as a sample A5. The sample which has the structure 2 and is formed using the condition 3 is referred to as a sample A6. The samples A4 to A6 each have the silicon nitride film 993 with a thickness of 50 nm The details of the conditions 1 to 3 are the same as those of the structure 1.

TDS analyses were performed on the samples A4 to A6 in order to evaluate an effect of suppressing movement of water. In each of the samples, the silicon wafer 991 was heated at 70° C. or higher and 580° C. or lower.

FIGS. 18A and 18B show the results of the TDS analyses on the samples A4 to A6 having the structure 2. FIG. 18A is a graph of an amount of released hydrogen molecules against the substrate temperature. FIG. 18B is a graph of an amount of released water molecules against the substrate temperature.

As shown in FIG. 18A, the TDS intensity of hydrogen molecules of the sample A5 is higher than that of the sample A4 and that of the sample A6. As shown in FIG. 18B, a minor peak is seen in the TDS intensity of water molecules; however, large difference is not seen among the samples A4 to A6.

The samples A4 to A6 having the structure 2 each have a very low intensity of a peak indicating the release of water molecules despite the presence of the silicon oxynitride film 995 containing water. Thus, with the formation conditions of the samples A4 to A6, an insulating film which can suppress movement of water.

However, the sample A2 including a silicon nitride film using a condition similar to that of the sample A5 has a large number of released hydrogen molecules, and the sample A3 has a large number of released ammonia molecules. In a transistor including an oxide semiconductor, when hydrogen and nitrogen are contained in an oxide semiconductor film, electrons serving as carriers are generated in the oxide semiconductor film and the transistor becomes normally on. Thus, hydrogen molecules and ammonia molecules which are sources for supplying nitrogen are both impurities which change electrical characteristics of a transistor. For example, in the sample A3, the amount of released ammonia molecules is large, which means that there are many nitrogen sources, and by forming such an insulating film over a transistor or in a gate insulating film of a transistor, the transistor becomes normally on.

Thus, the nitride insulating film which releases a small number of hydrogen molecules and ammonia molecules, such as the silicon nitride film formed under the condition 1 used in the sample A1 and the sample A4 is provided over a transistor including an oxide semiconductor film. As a result, a transistor in which a change in electrical characteristics is suppressed or a transistor whose reliability is improved can be manufactured. Further, as a gate insulating film of the transistor including the oxide semiconductor film, a nitride insulating film which releases a small number of released hydrogen molecules and released ammonia molecules, such as a silicon nitride film formed under the condition 1 using in the samples A1 and A4, is provided, whereby a transistor in which variation in electrical characteristics is suppressed or a transistor with improved reliability can be manufactured.

Next, transistors including silicon nitride films formed under the conditions 1 to 3 were manufactured and the Vg-Id characteristics were measured.

A manufacturing process of a transistor included in each of a sample B1, a sample B2, and a sample B3 is described. In this example, the process is described with reference to FIGS. 2A to 2D.

First, as illustrated in FIG. 2A, a glass substrate was used as the substrate 11, and the gate electrode 15 was formed over the substrate 11.

A 100 nm-thick tungsten film was formed by a sputtering method, a mask was formed over the tungsten film by a photolithography process, and part of the tungsten film was etched with the use of the mask, so that the gate electrode 15 was formed.

Next, the gate insulating film 18 was formed over the gate electrode 15.

As the gate insulating film 18, a stacked layer including a 50-nm-thick silicon nitride film and a 200-nm-thick silicon oxynitride film were stacked. The silicon nitride film was formed in the following conditions: silane and nitrogen were supplied at 50 sccm and 5000 sccm, respectively, into a treatment chamber of a plasma CVD apparatus; the pressure of the treatment chamber was adjusted to 60 Pa; and power of 150 W was supplied with the use of a 27.12 MHz high-frequency power source. The silicon oxynitride film was formed in the following conditions: silane and dinitrogen monoxide were supplied at 20 sccm and 3000 sccm, respectively, into the treatment chamber of the plasma CVD apparatus; the pressure of the treatment chamber was adjusted to 40 Pa; and power of 100 W was supplied with the use of a 27.12 MHz high-frequency power source. Note that each of the silicon nitride film and the silicon oxynitride film was formed at a substrate temperature of 350° C.

Next, the oxide semiconductor film 19 overlapping with the gate electrode 15 with the gate insulating film 18 provided therebetween was formed.

Here, an IGZO film which was a CAAC-OS film was formed over the gate insulating film 18 by a sputtering method, a mask is formed over the IGZO film by a photolithography process, and the IGZO film was partly etched using the mask. Then, the etched IGZO film was subjected to heat treatment, so that the oxide semiconductor film 19 was formed. Note that the IGZO film formed in this example has a thickness of 35 nm.

The IGZO film was formed in such a manner that a sputtering target where In:Ga:Zn=1:1:1 (atomic ratio) was used, argon and oxygen were supplied as a sputtering gas into a treatment chamber of a sputtering apparatus at a flow rate of 50 sccm for each, the pressure in the treatment chamber was controlled to be 0.6 Pa, and direct-current power of 5 kW was supplied. Note that the IGZO film was formed at a substrate temperature of 170° C.

Next, water, hydrogen, and the like contained in the oxide semiconductor film were released by heat treatment. Here, heat treatment at 450° C. for one hour in a nitrogen atmosphere was performed, and then heat treatment at 450° C. for one hour in an atmosphere of nitrogen and oxygen was performed.

For the structure obtained through the steps up to here, FIG. 2B can be referred to.

Next, after the gate electrode was exposed by etching a part of the gate insulating film 18 (not illustrated), the pair of electrodes 21 in contact with the oxide semiconductor film 19 was formed as illustrated in FIG. 2C.

A conductive film was formed over the gate insulating film 18 and the oxide semiconductor film 19, a mask was formed over the conductive film by a photolithography process, and the conductive film was partly etched using the mask, so that the pair of electrodes 21 was formed. Note that as the conductive film, a 400-nm-thick aluminum film was formed over a 50-nm-thick tungsten film, and a 100-nm-thick titanium film was formed over the aluminum film.

Next, after the substrate was moved to a treatment chamber under reduced pressure and heated at 220° C., the substrate was moved to a treatment chamber filled with dinitrogen monoxide. Then, the oxide semiconductor film 19 was exposed to oxygen plasma which was generated in such a manner that an upper electrode provided in the treatment chamber was supplied with high-frequency power of 150 W with the use of a 27.12 MHz high-frequency power source.

Next, the insulating film 23 was formed in succession over the oxide semiconductor film 19 and the pair of electrodes 21 without exposure to the atmosphere after the above plasma treatment. A 50-nm-thick first silicon oxynitride film and a 400-nm-thick second silicon oxynitride film were stacked.

The first silicon oxynitride film was formed by a plasma CVD method under the following conditions: silane with a flow rate of 30 sccm and dinitrogen monoxide with a flow rate of 4000 sccm were used as a source gas, the pressure in a treatment chamber was 40 Pa, the substrate temperature was 220° C., and high-frequency power of 150 W was supplied to parallel-plate electrodes.

The second silicon oxynitride film was formed by a plasma CVD method under the following conditions: silane with a flow rate of 160 sccm and dinitrogen monoxide with a flow rate of 4000 sccm were used as a source gas, the pressure in the treatment chamber was 200 Pa, the substrate temperature was 220° C., and high-frequency power of 1500 W was supplied to the parallel-plate electrodes. Under the above conditions, it is possible to form a silicon oxynitride film whose oxygen content is in excess of that in the stoichiometric composition and from which part of oxygen is released by heating.

Next, water, hydrogen, and the like were released from the insulating film 23 by heat treatment. Here, the heat treatment was performed in an atmosphere of nitrogen and oxygen at 350° C. for one hour.

Figure 2D:
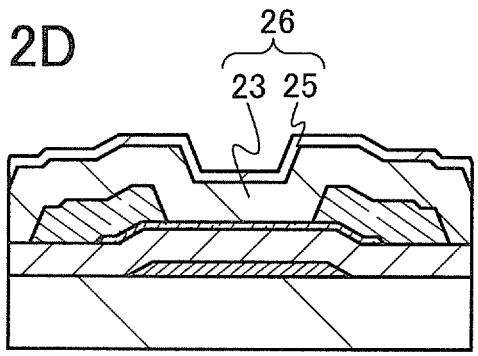

Next, as illustrated in FIG. 2D, the nitride insulating film 25 was formed over the insulating film 23.

In the sample B1, as the nitride insulating film 25, the silicon nitride film was formed under the condition 1 of the sample A1.

In the sample B2, as the nitride insulating film 25, the silicon nitride film was formed under the condition 2 of the sample A2.

In the sample B3, as the nitride insulating film 25, the silicon nitride film was formed under the condition 3 of the sample A3.

Next, although not illustrated, parts of the insulating film 23 and the nitride insulating film 25 were etched, and openings which expose part of the pair of electrodes were formed.

Next, a planarization film (not illustrated) was formed over the nitride insulating film 25. Here, the nitride insulating film 25 was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in a nitrogen atmosphere for one hour.

Next, a conductive film connected to part of the pair of electrodes is formed (not illustrated). Here, a 100-nm-thick ITO film containing silicon oxide was formed by a sputtering method.

Through these steps, transistors in the samples B1 to B3 were manufactured.

Next, Vg-Id characteristics of the transistors in the samples B1 to B3 were measured.

Next, a pressure cooker test (PCT) was performed as the accelerated life test to evaluate moisture resistance. In the PCT in this example, the samples B1 to B3 were held for 15 hours under the following conditions: the temperature was 130° C., the humidity was 85%, and the pressure was 0.23 MPa.

FIGS. 20A to 20C, FIGS. 21A to 21C, and FIGS. 22A to 22C show Vg-Id initial characteristics of the transistors included in the samples B1 to B3 and Vg-Id characteristics of the transistors included in the samples B1 to B3 after the pressure cooker test.

Figure 20A:
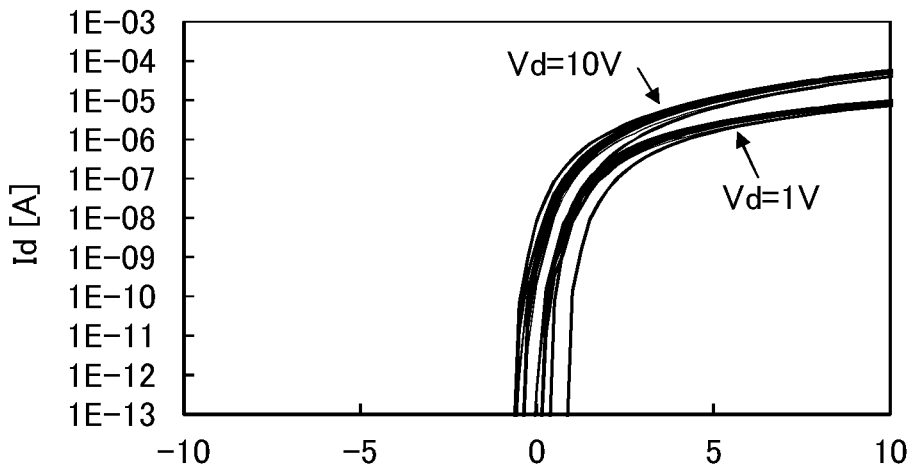
FIGS. 20A to 20C each show Vg-Id characteristics of a transistor.
Figure 20B:
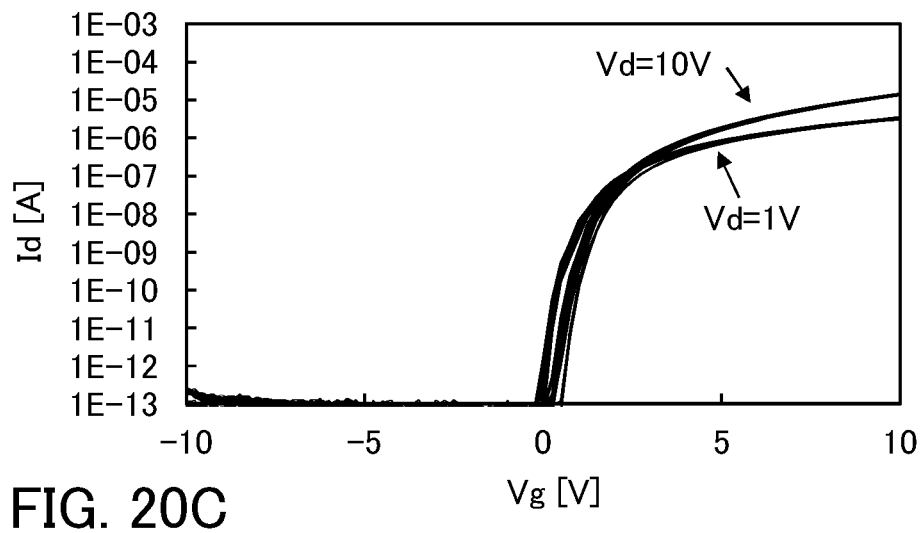
Figure 20C:
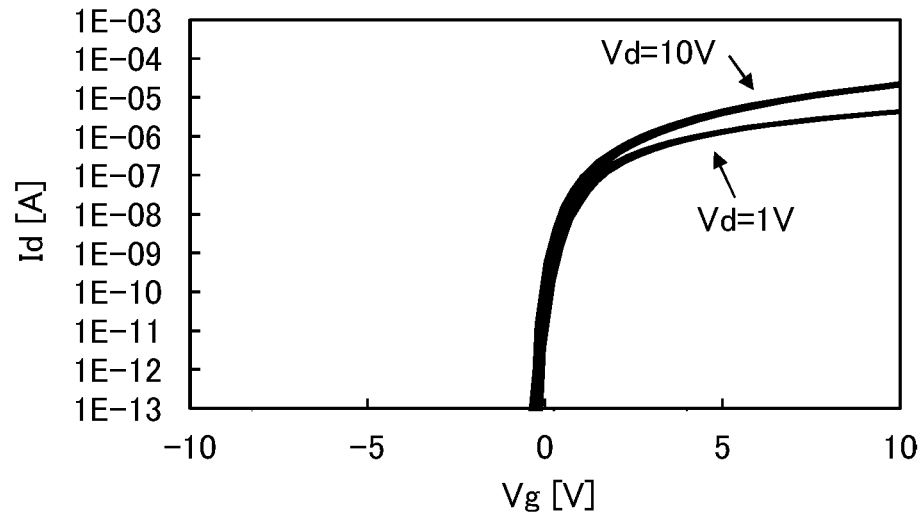
Figure 21A:
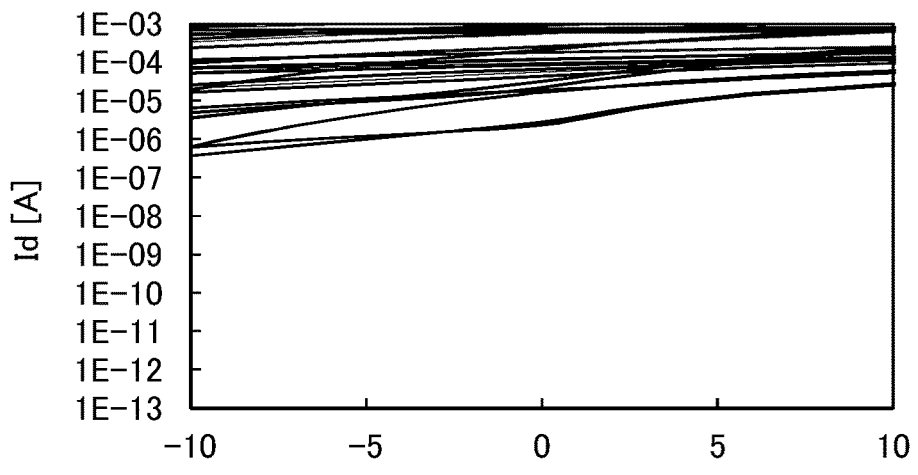
FIGS. 21A to 21C each show Vg-Id characteristics of a transistor.
Figure 21B:
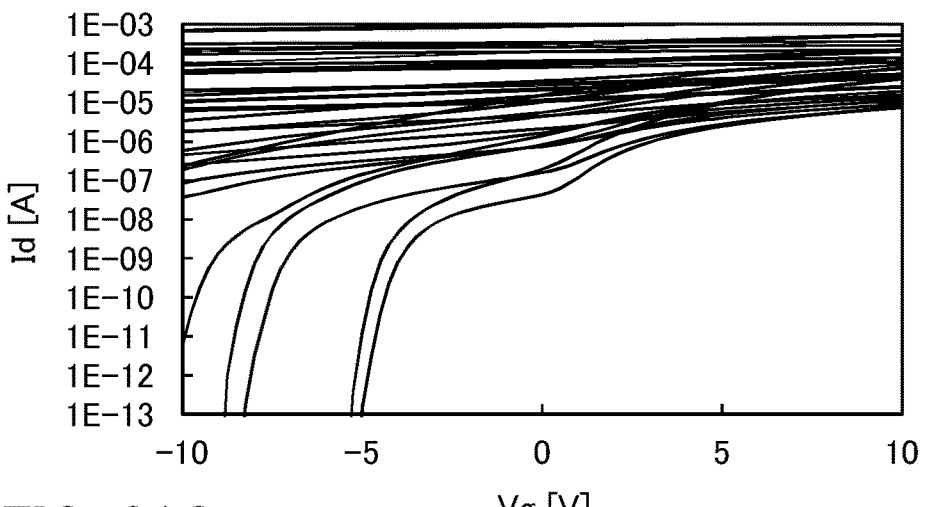
Figure 21C:
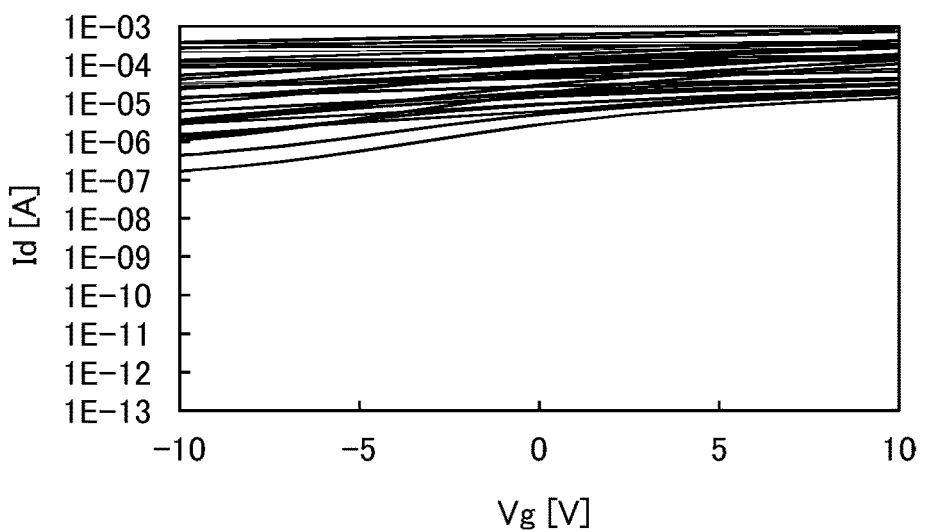
Figure 22A:
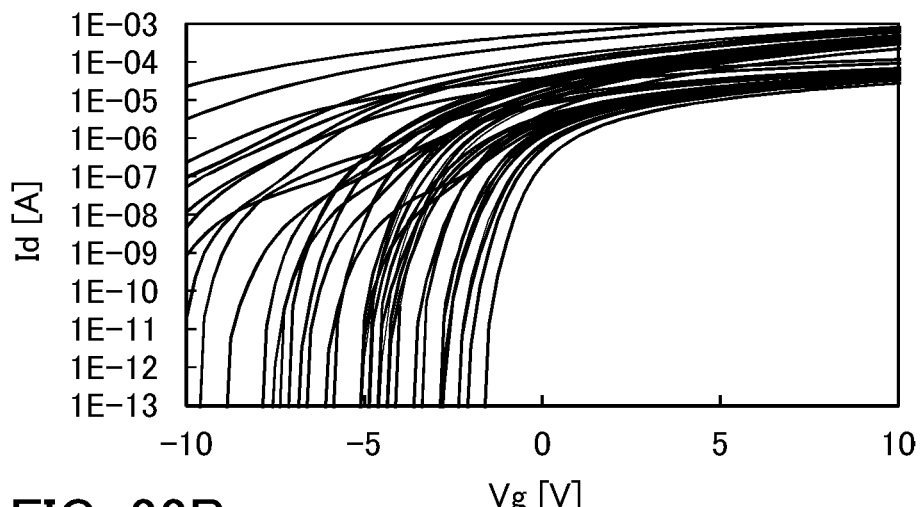
FIGS. 22A to 22C each show Vg-Id characteristics of a transistor.
Figure 22B:
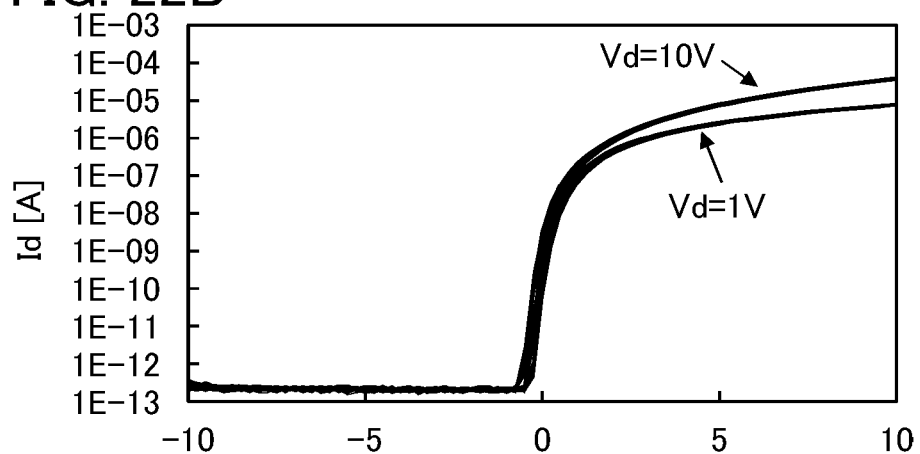
Figure 22C:
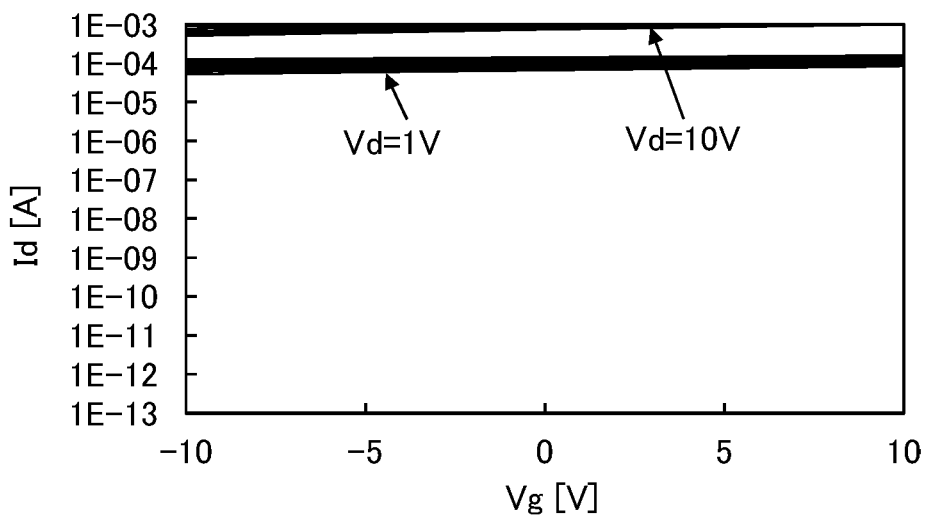

Note that in each of the samples, Vg-Id characteristics of a transistor 1 whose channel length (L) is 2 μm and channel width (W) is 50 μm and a transistor 2 whose channel length (L) is 6 μm and channel width (W) is 50 μm were measured. The initial characteristics of the transistors 1 in the samples B1 to B3 are shown in FIG. 20A, FIG. 21A, and FIG. 22A, the initial characteristics of the transistors 2 in the samples B1 to B3 are shown in FIG. 20B, FIG. 21B, and FIG. 22B, and the Vg-Id characteristics of the transistors 2 in the samples B1 to B3 after the pressure cooker test are shown in FIG. 20C, FIG. 21C, and FIG. 22C. Further, in each of the samples, 24 transistors having the same structure were manufactured on the substrate.

According to the Vg-Id characteristics shown in FIG. 21A, the transistors do not have switching characteristics. Further, according to the Vg-Id characteristics shown in FIG. 22A, variation in threshold voltage of the transistors is large. However, according to the Vg-Id characteristics shown in FIG. 20A, it is found that the transistors has favorable switching characteristics and variation in threshold voltage of the transistors is small.

It is found that variation in threshold voltage of the transistor in the initial characteristics of the Vg-Id characteristics shown in FIG. 20B and FIG. 22B is smaller than that in the initial characteristics of the Vg-Id characteristics shown in FIG. 21B.

The Vg-Id characteristics shown in FIG. 20C have more favorable switching characteristics than the Vg-Id characteristics after the pressure cooker test shown in FIG. 21C and FIG. 22C.

For the above reasons, a nitride insulating film which releases a small number of hydrogen molecules and ammonia molecules is formed over a transistor, whereby a shift of threshold voltage in the negative direction can be reduced and the reliability of the transistor can be improved.

Next, a plurality of samples was manufactured by forming the nitride insulating film 25 through the same process as the samples B1 to B3 in this example and under a condition other than the conditions 1 to 3. In each of the samples, 24 transistors having the same structure were formed on the substrate, and the Vg-Id initial characteristics of the transistors were compared to one another. Note that in each of the transistors, the channel length (L) is 2 μm and the channel width (W) is 50 μm.

Figure 23:
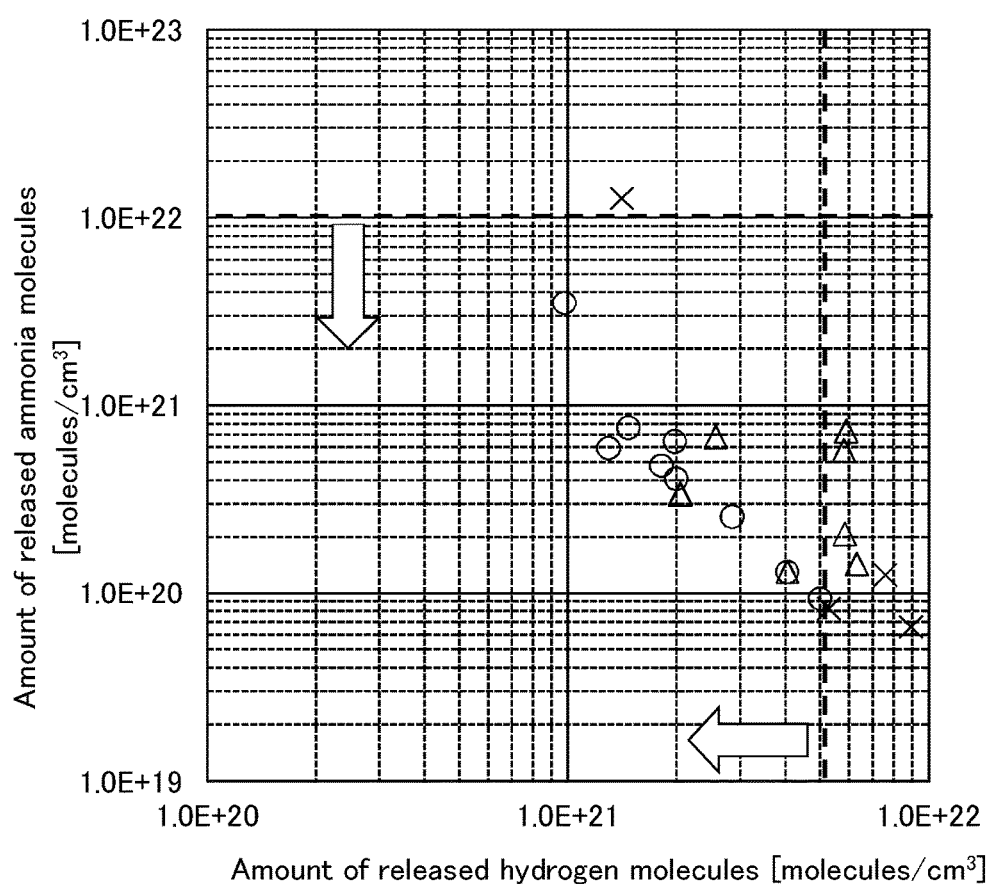
FIG. 23 shows an amount of released hydrogen molecules and an amount of released ammonia molecules from a silicon nitride film, and Vg-Id characteristics of a transistor.

FIG. 23 shows a relation between an amount of released hydrogen molecules and an amount of released ammonia molecules from the nitride insulating film 25 and the Vg-Id initial characteristics of the transistors in the plurality of samples in which the nitride insulating film 25 is formed under a condition of the samples B1 to B3 or a condition other than the conditions 1 to 3.

In FIG. 23, the horizontal axis indicates the amount of hydrogen molecules released from the nitride insulating film 25 and the vertical axis indicates the amount of ammonia molecules released from the nitride insulating film 25. Further, in FIG. 23, circles indicate that the difference between the maximum threshold voltage and the minimum threshold voltage (Vth_max−Vth_min) in the 24 transistors on the substrate is less than or equal to 1 V. Further, triangles indicate that Vth_max−Vth_min is greater than 1 V and less than or equal to 3 V. Further, crosses indicate that Vth_max−Vth_min is greater than 3 V.

In FIG. 23, crosses are not plotted in the region where the amount of released hydrogen molecules from the nitride insulating film 25 is smaller than $5 \times 10^{21}$ molecules/cm$^3$ and the amount of released ammonia molecules from the nitride insulating film 25 is smaller than $1 \times 10^{22}$ molecules/cm$^3$. Accordingly, it is found that a nitride insulating film which releases hydrogen molecules less than $5 \times 10^{21}$ molecules/cm$^3$ and ammonia molecules less than $1 \times 10^{22}$ molecules/cm$^3$ is provided over a transistor, whereby variation in threshold voltage of the transistor can be reduced. Moreover, a shift of the threshold voltage in the negative direction can be suppressed.

REFERENCE NUMERALS

1: transistor, 3: transistor, 5: transistor, 7: transistor, 9: transistor, 11: substrate, 15: gate electrode, 18: gate insulating film, 19: oxide semiconductor film, 21: electrode, 23: insulating film, 24a: insulating film, 24b: insulating film, 25: nitride insulating film, 26: protective film, 27: planarization film, 28: protective film, 29: conductive film, 30: opening, 31: substrate, 33: base insulating film, 34: oxide semiconductor film, 35: electrode, 37: insulating film, 38a: insulating film, 38b: insulating film, 39: nitride insulating film, 40: gate insulating film, 41: gate electrode, 42: gate insulating film, 43: planarization film, 45: conductive film, 47: opening, 61: gate electrode, 601: substrate, 602: photodiode, 606a: semiconductor film, 606b: semiconductor film, 606c: semiconductor film, 608: adhesive layer, 613: substrate, 632: insulating film, 633: planarization film, 634: planarization film, 640: transistor, 641a: electrode, 641b: electrode, 642: electrode, 643: conductive film, 645: conductive film, 656: transistor, 658: photodiode reset signal line, 659: gate signal line, 671: photo sensor output signal line, 672: photo sensor reference signal line, 901: substrate, 902: pixel portion, 903: signal line driver circuit, 904: scan line driver circuit, 905: sealant, 906: substrate, 908: liquid crystal layer, 910: transistor, 911: transistor, 913: liquid crystal element, 915: connection terminal electrode, 915a: connection terminal electrode, 915b: connection terminal electrode, 916: terminal electrode, 917: conductive film, 918: FPC, 918b: FPC, 919: anisotropic conductive agent, 921: planarization film, 922: gate insulating film, 923: insulating film, 924: insulating film, 925: sealant, 930: electrode, 931: electrode, 932: insulating film, 933: insulating film, 935: spacer, 936: sealant, 941: electrode, 943: liquid crystal element, 944: insulating film, 950: silicon nitride film, 951: electrode, 955: connection terminal electrode, 960: partition wall, 961: light-emitting layer, 963: light-emitting element, 964: filler, 971: source electrode, 973: drain electrode, 975: common potential line, 977: common electrode, 985: common potential line, 987: common electrode, 991: silicon wafer, 993: silicon nitride film, 995: silicon oxynitride film, 9000: table, 9001: housing, 9002: leg portion, 9003: display portion, 9004: displayed button, 9005: power cord, 9033: clip, 9034: switching button, 9035: power button, 9036: switching button, 9038: operation button, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar battery, 9634: charge and discharge control circuit, 9635: battery, 9636: DCDC converter, 9637: converter, 9638: operation key, 9639: button.

This application is based on Japanese Patent Application serial no. 2012-147703 filed with Japan Patent Office on Jun. 29, 2012, the entire contents of which are hereby incorporated by reference.

The invention claimed is:

1. A semiconductor device comprising:
a gate electrode;
an oxide semiconductor film overlapping with a part of the gate electrode with a gate insulating film interposed therebetween;
a pair of electrodes in contact with the oxide semiconductor film; and
a nitride insulating film over the oxide semiconductor film,
wherein in the case where the nitride insulating film is analyzed by thermal desorption spectroscopy, hydrogen molecules less than $5 \times 10^{21}$ molecules/cm$^3$ and ammonia molecules less than $1 \times 10^{22}$ molecules/cm$^3$ are released.

2. The semiconductor device according to claim 1, wherein the pair of electrodes is interposed between the gate insulating film and the oxide semiconductor film.

3. The semiconductor device according to claim 1, wherein the pair of electrodes is interposed between the oxide semiconductor film and the nitride insulating film.

4. The semiconductor device according to claim 1, wherein a planarization film is over the nitride insulating film.

5. The semiconductor device according to claim 4, wherein the planarization film is an organic resin.

6. The semiconductor device according to claim 1, wherein an oxide insulating film is interposed between the oxide semiconductor film and the nitride insulating film.

7. The semiconductor device according to claim 1, wherein an oxide insulating film whose oxygen content is in excess of that in the stoichiometric composition is interposed between the oxide semiconductor film and the nitride insulating film.

8. The semiconductor device according to claim 6, wherein the oxide insulating film is silicon oxide or silicon oxynitride.

9. The semiconductor device according to claim 1, wherein the nitride insulating film is silicon nitride or silicon nitride oxide.

10. A semiconductor device comprising:
a an oxide semiconductor film;
a pair of electrodes in contact with the oxide semiconductor film;
a gate insulating film over the oxide semiconductor film; and
a gate electrode over the gate insulating film,
wherein the gate insulating film comprises a nitride insulating film, and
wherein in the case where the nitride insulating film is analyzed by thermal desorption spectroscopy, hydrogen molecules less than $5 \times 10^{21}$ molecules/cm$^3$ and ammonia molecules less than $1 \times 10^{22}$ molecules/cm$^3$ are released.

11. The semiconductor device according to claim 10, wherein the pair of electrodes is interposed between the oxide semiconductor film and the nitride insulating film.

12. The semiconductor device according to claim 10, wherein an oxide insulating film is interposed between the oxide semiconductor film and the nitride insulating film.

13. The semiconductor device according to claim 10, wherein an oxide insulating film whose oxygen content is in excess of that in the stoichiometric composition is interposed between the oxide semiconductor film and the nitride insulating film.

14. The semiconductor device according to claim 12, wherein the oxide insulating film is silicon oxide or silicon oxynitride.

15. The semiconductor device according to claim 10, wherein the nitride insulating film is silicon nitride or silicon nitride oxide.

16. A semiconductor device comprising:
a gate electrode;
an oxide semiconductor film overlapping with a part of the gate electrode with a gate insulating film interposed therebetween;
a pair of electrodes in contact with the oxide semiconductor film; and
an insulating film over the oxide semiconductor film,
wherein at least one of the gate insulating film and the insulating film comprises a nitride insulating film from which hydrogen molecules less than $1 \times 10^{21}$ molecules/cm$^3$ and ammonia molecules less than $1 \times 10^{21}$ molecules/cm$^3$ are released when analyzed by thermal desorption spectroscopy.

17. The semiconductor device according to claim 16, wherein the pair of electrodes is interposed between the gate insulating film and the oxide semiconductor film.

18. The semiconductor device according to claim 16, wherein the oxide semiconductor film is interposed between the pair of electrodes and the gate insulating film.

19. The semiconductor device according to claim 16, wherein the nitride insulating film is silicon nitride or silicon nitride oxide.

* * * * *